US007868796B2

(12) United States Patent
Berens et al.

(10) Patent No.: US 7,868,796 B2
(45) Date of Patent: Jan. 11, 2011

(54) SELF-CALIBRATING DATA CONVERSION CIRCUITRY AND METHOD THEREFOR

(75) Inventors: Michael T. Berens, Austin, TX (US); James R. Feddeler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/242,124

(22) Filed: Sep. 30, 2008

(65) Prior Publication Data

US 2010/0079319 A1   Apr. 1, 2010

(51) Int. Cl.
*H03M 1/10* (2006.01)
(52) U.S. Cl. .................. 341/120; 341/155; 341/163
(58) Field of Classification Search .......... 341/155, 341/120, 144, 150, 118, 172
See application file for complete search history.

(56) References Cited

U.S. PATENT DOCUMENTS

| 4,222,107 | A |   | 9/1980  | Mrozowski et al. |
|-----------|---|---|---------|------------------|
| 4,272,760 | A |   | 6/1981  | Prazak et al.    |
| 4,348,658 | A |   | 9/1982  | Carter           |
| 4,399,426 | A |   | 8/1983  | Tan              |
| 4,451,821 | A |   | 5/1984  | Domogalla        |
| 4,599,604 | A |   | 7/1986  | McKenzie et al.  |
| 4,679,028 | A |   | 7/1987  | Wilson et al.    |
| 4,970,514 | A |   | 11/1990 | Draxelmayr       |
| 5,132,685 | A |   | 7/1992  | DeWitt et al.    |
| 5,361,067 | A | * | 11/1994 | Pinckley ............. 341/120 |
| 5,594,555 | A |   | 1/1997  | Ishida           |
| 5,594,612 | A |   | 1/1997  | Henrion          |
| 5,687,003 | A |   | 11/1997 | Nagano           |
| 5,691,720 | A |   | 11/1997 | Wang et al.      |
| 5,764,175 | A |   | 6/1998  | Pan              |
| 5,818,370 | A | * | 10/1998 | Sooch et al. ............. 341/120 |
| 5,977,893 | A |   | 11/1999 | Chen et al.      |
| 6,075,478 | A |   | 6/2000  | Abe              |
| 6,268,813 | B1 |  | 7/2001  | de Wit           |
| 6,340,944 | B1 |  | 1/2002  | Chang et al.     |
| 6,348,885 | B1 |  | 2/2002  | Munoz et al.     |
| 6,362,762 | B1 |  | 3/2002  | Jensen et al.    |
| 6,400,302 | B1 |  | 6/2002  | Amazeen et al.   |
| 6,404,375 | B1 |  | 6/2002  | Munoz et al.     |
| 6,417,794 | B1 |  | 7/2002  | Munoz et al.     |

(Continued)

OTHER PUBLICATIONS

Gulati et al; "A Low-Power Reconfigurable Analog-to-Digital Converter" IEEE Journal of Solid-State Circuits, vol. 36, No. 12, Dec. 2001, pp. 1900-1911.

(Continued)

*Primary Examiner*—Peguy JeanPierre
(74) *Attorney, Agent, or Firm*—Susan C. Hill

(57) ABSTRACT

A data converter for converting analog signals to digital signals, or for converting digital signals to analog signals is provided. In one embodiment, a production self-test is provided. In one embodiment, a high-speed lower-resolution method or mode for a data converter is provided. In one embodiment, a differential data converter with a more stable comparator common mode voltage is provided. In one embodiment, the input range of a digitally calibrated data converter is provided and maintained so that there is no loss in input range due to the calibration. In one embodiment, digital post-processing of an uncalibrated result using a previously stored calibration value is provided.

18 Claims, 17 Drawing Sheets

U.S. PATENT DOCUMENTS

| | | | |
|---|---|---|---|
| 6,424,276 B1 * | 7/2002 | Munoz et al. | 341/120 |
| 6,433,712 B1 | 8/2002 | Ohnhaeuser et al. | |
| 6,448,911 B1 | 9/2002 | Somayajula | |
| 6,486,806 B1 | 11/2002 | Munoz et al. | |
| 6,559,789 B1 | 5/2003 | Somayajula | |
| 6,566,857 B1 | 5/2003 | Kakizawa et al. | |
| 6,621,431 B2 * | 9/2003 | Engl et al. | 341/120 |
| 6,791,484 B1 | 9/2004 | Lee et al. | |
| 6,864,820 B2 | 3/2005 | Nakamura et al. | |
| 6,882,298 B2 | 4/2005 | Leung et al. | |
| 6,891,487 B2 | 5/2005 | Leung et al. | |
| 6,924,755 B1 | 8/2005 | Callanan et al. | |
| 6,940,445 B2 | 9/2005 | Kearney | |
| 6,965,332 B2 | 11/2005 | Nakamura et al. | |
| 6,975,950 B2 * | 12/2005 | Bardsley | 702/106 |
| 7,158,070 B1 | 1/2007 | Yang et al. | |
| 7,180,439 B1 | 2/2007 | Bakker | |
| 7,271,758 B2 | 9/2007 | Piasecki et al. | |
| 7,439,898 B1 | 10/2008 | Nittala et al. | |
| 7,443,323 B2 * | 10/2008 | Rotchford et al. | 341/120 |
| 2007/0018939 A1 | 1/2007 | Chen et al. | |
| 2009/0075610 A1 | 3/2009 | Keehr et al. | |
| 2009/0201237 A1 | 8/2009 | Nishimura | |
| 2009/0244014 A1 | 10/2009 | Hotelling et al. | |

OTHER PUBLICATIONS

Hester et al; "Fully Differential ADC with Rail-to-Rail Common-Mode Range and Nonlinear Capacitor Compensation"; IEEE Journal of Solid-State Circuits, vol. 25, No. 1, Feb. 1990.

Notice of Allowance mailed Dec. 24, 2010 on Related Application 122420058.

Office Action mailed Dec. 2, 2009 on Related U.S. Appl. No. 12/242,077.

Office Action mailed Dec. 3, 2009 on Related U.S. Appl. No. 12/242,093.

Office Action mailed Jan. 11, 2010 on Related U.S. Appl. No. 12/242,112.

PCT/US2009/052822 International Search Report and Written Opinion mailed Mar. 2, 2010.

De Vries, R. et al.; "Built-In Self-Test Methodology for A/D Converters"; 1997 European Design and Test Conference; Mar. 17-20, 1997; pp. 353-358; IEEE.

Lee; "A Self-Calibrating 15 bit CMOS A/D Converter"; IEEE Journal of Solid-State Circuits; vol. SC-19, No. 6; Dec. 1984.

Neubauer; "A Successive Approximation A/D Converter with 16bit 200kS/s in 0.6pm CMOS using Self-Calibration and Low Power Techniques"; IEEE; 2001.

* cited by examiner

SELF-CALIBRATING DATA CONVERSION CIRCUITRY AND METHOD THEREFOR

CROSS-REFERENCE TO RELATED APPLICATION(S)

This application is related to U.S. patent application Ser. No. 12/242,058, filed on even date, entitled "DATA CONVERSION CIRCUITRY AND METHOD THEREFOR," and assigned to the current assignee hereof.

This application is related to U.S. patent application Ser. No. 12/242,077, filed on even date, entitled "DATA CONVERSION CIRCUITRY AND METHOD THEREFOR," and assigned to the current assignee hereof.

This application is related to U.S. patent application Ser. No. 12/242,112, filed on even date, entitled "DATA CONVERSION CIRCUITRY AND METHOD THEREFOR," and assigned to the current assignee hereof.

This application is related to U.S. patent application Ser. No. 12/242,124, filed on even date, entitled "DATA CONVERSION CIRCUITRY AND METHOD THEREFOR," and assigned to the current assignee hereof.

BACKGROUND

1. Field

This disclosure relates generally to electrical circuitry, and more specifically, to electrical circuitry for data conversion.

2. Related Art

Data converters are very useful for converting analog signals to digital signals, and for converting digital signals to analog signals. Many applications require data converters that have a high resolution, fast conversion time, allow a broad range of inputs, and yet are cost effective. Other data conversion features may also be important for various applications. It is thus important to be able to provide data converters that meet a wide variety of potentially conflicting criteria, while at the same time remain cost effective.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
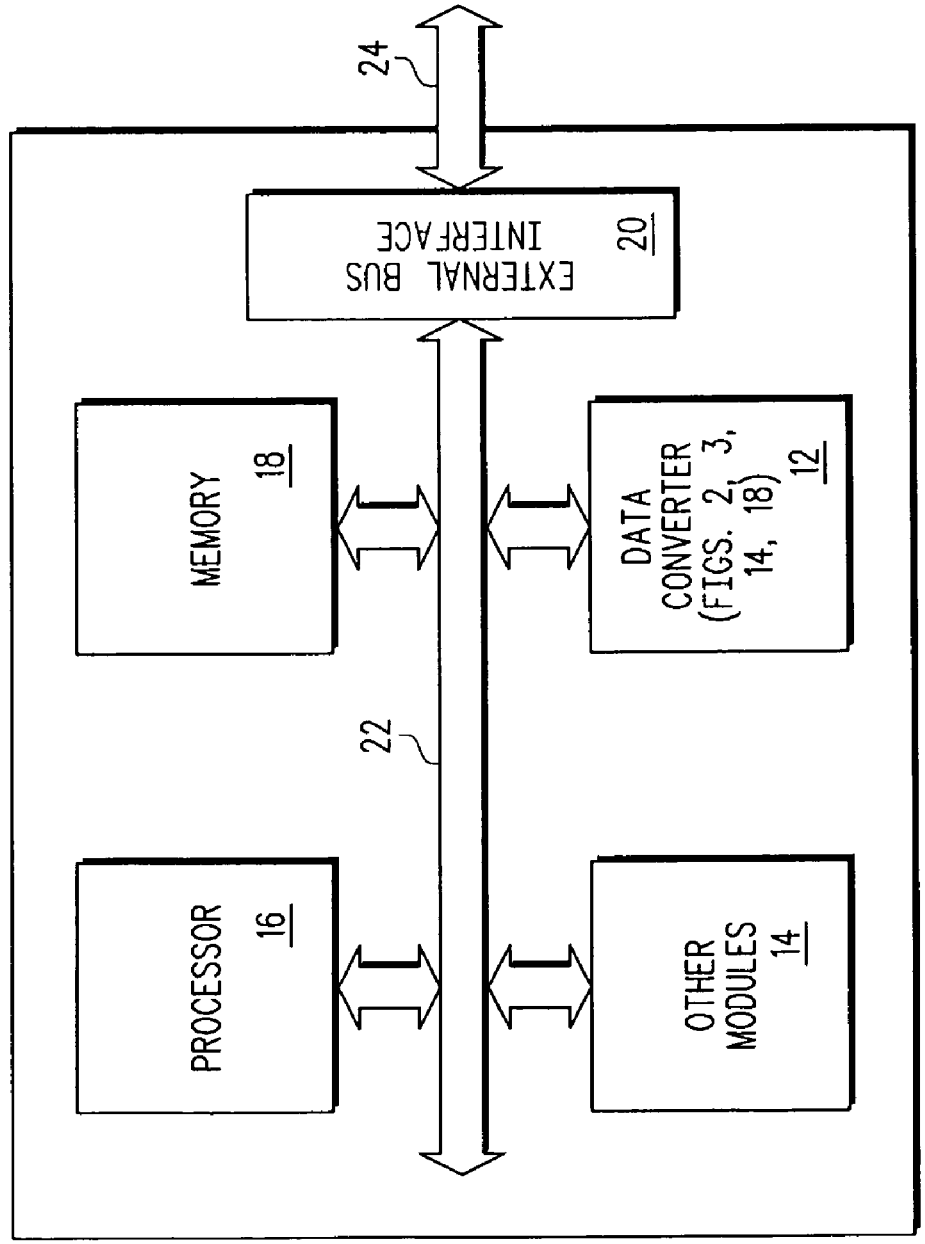
FIG. 1 illustrates, in block diagram form, a system in accordance with one embodiment.

FIG. 1 illustrates one embodiment of a system 10. In alternate embodiments, system 10 may be implemented as a single integrated circuit, may be implemented as a plurality of integrated circuits, or may be implemented as a combination of integrated circuits and discrete components. Alternate embodiments may implement system 10 in any manner.

In one embodiment, system 10 comprises data converter 12, other modules 14, processor 16, memory 18, and external bus interface 20, which are all bi-directionally coupled to each other by way of a bus 22 or a plurality of electrical signals 22. In one embodiment, system 10 can receive inputs and provide outputs by way of a bus 24 or a plurality of electrical signals 24 coupled to external bus interface 20. In alternate embodiments, system 10 may comprises fewer, more, or different blocks of circuitry than those illustrated in FIG. 1.

Figure 2:
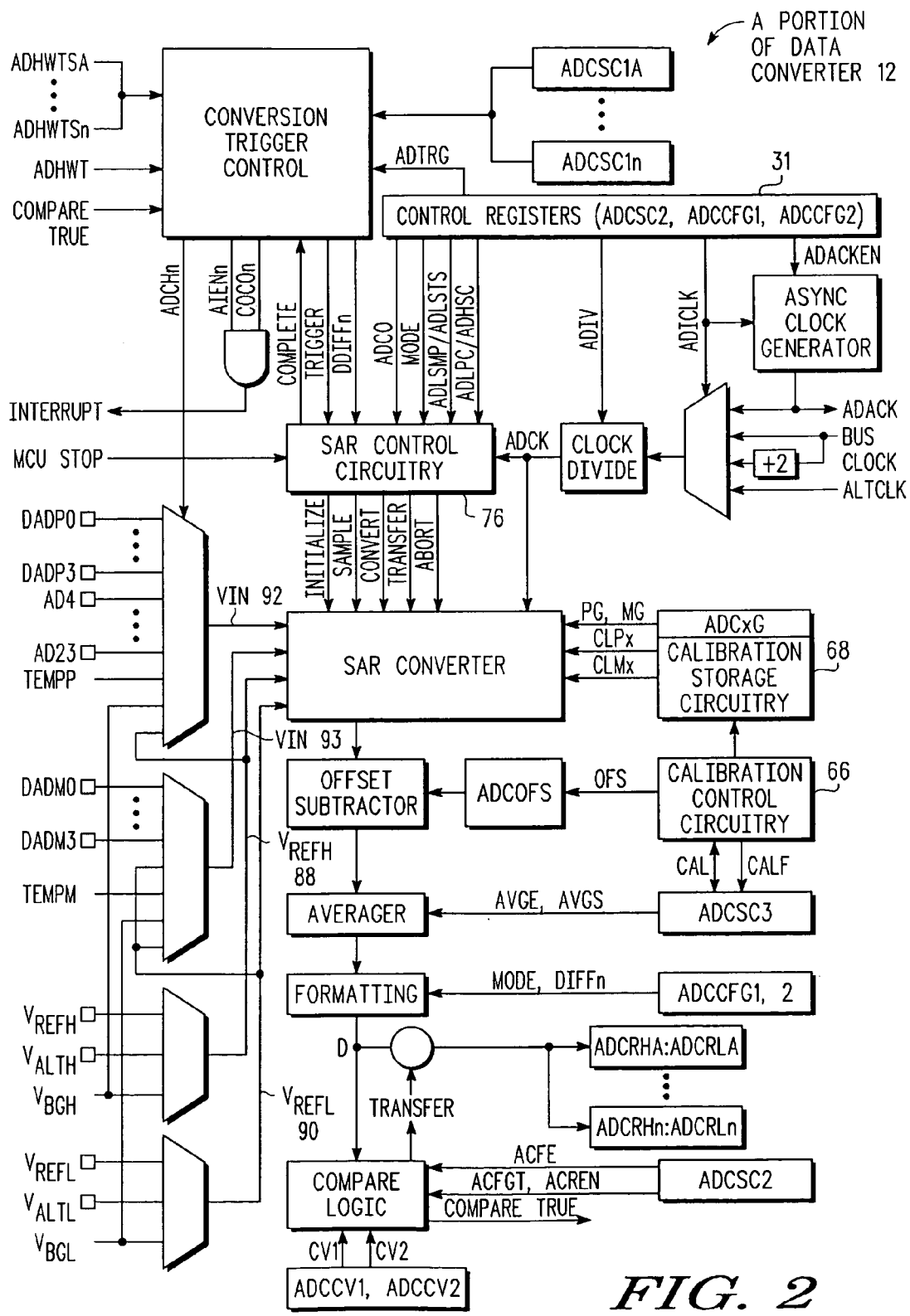
FIG. 2 illustrates, in partial block diagram form and partial schematic diagram form, a portion of a data converter in accordance with one embodiment.

FIG. 2 illustrates one embodiment of a portion of data converter 12 of FIG. 1. In one embodiment, data converter 12 comprises an ADC which may be used to convert a differential input voltage VIN 92-VIN 93 into a digital representation stored as a multi-bit binary value in a data register (e.g. ADCRHA:ADCRLA or ADCRHB:ADCRLB). In one embodiment, this digital representation may be of the value $2^N*(VIN\ 92-VIN\ 93)/(VREFSH\ 88-VREFSL\ 90)$, where N is the resolution, or number of bits, in data converter 12. In one embodiment, data converter 12 comprises a first input multiplexer which chooses from among a plurality of positive input voltages (DADP[0:3], AD[4:23], TEMPP) based on software configuration (ADCHN) to create VIN 92, and which also comprises a second input multiplexer which chooses from among a plurality of negative input voltages (DADM[0:3], TEMPM) to create VIN 93. Data converter 12 also comprises a reference multiplexer which chooses from among a plurality of positive reference voltages (VREFH, VALTH, VBGH) to create VREFH 88, and a second reference multiplexer which chooses from among a plurality of negative reference voltages (VREFL, VALTL, VBGL) to create VREFL 90. Note that the terms "positive" and "negative" indicate the polarity of the signal relative to the other, and not to a fixed reference such as ground. In one embodiment, both positive and negative signals and references are always equal to or greater than a ground reference. Alternate embodiments may function in a different manner.

For one embodiment, the SAR (successive approximation register) control circuitry 76 begins a conversion by placing the SAR Converter in an initial condition by asserting the INITIALIZE signal. A conversion will begin when a trigger to convert signal (TRIGGER) is received by the SAR control circuitry 76 from the conversion trigger control circuit. Alternate embodiments may provide a trigger signal due to a variety of different circumstances. For example, a trigger may be received when a software register bit is written (ADTRG), or when a hardware signal ADHWT is received in the right conditions (e.g. these conditions may be determined by software configuration [ADCSC1A-ADCSC1N, ADCSC2, ADCCFG1 and ADCCFG2] and/or hardware signal conditioning [ADHWTSA-ADHWTSN]). When the asserted trigger signal is received, the SAR control circuitry 76 asserts the SAMPLE condition to the SAR converter, which in turn samples the differential input voltage VIN 92-VIN 93 on the SAR array. The sample value can be modified by the PG and MG configurations stored in the calibration storage circuitry 68.

In one embodiment, the SAR converter samples for a period indicated by software configuration (ADLSMP, ADLSTS) in a multiple of the ADC input clock (ADCK) periods. The ADCK period may be controlled by software configurations (ADIV, ADICLK, ADACKEN) and hardware clock sources (ADACK, BUS_CLOCK, and ALTCLK). The SAR control circuitry 76 then places the SAR converter into CONVERT mode. In one embodiment of CONVERT mode, the SAR converter subsequently compares the input voltage (VIN 92-VIN 93) to different fractions of the reference voltage (VREFSH 88-VREFSL 90). During each comparison, the converter successively sets or clears the corresponding digital output bit based on the compare result, and then changes either the reference voltage or the input voltage by the appropriate fraction of the reference voltage (e.g. if comparing the input voltage to the reference voltage divided by two, if the comparison is greater, the output bit is set and the next comparison is to ¾ times the reference voltage; if less, the output bit is cleared and the next comparison is to ¼ times the reference voltage; either the reference voltage or the input voltage may be modified during successive approximation).

As the SAR converter approximates, it may modify the result as it proceeds with the values CLPx and CLMx stored in the calibration storage circuitry 68. When the SAR converter has made the appropriate number of successive approximations, SAR control circuitry 76 indicates that it is COMPLETE to the SAR trigger circuitry and instructs the SAR converter to TRANSFER the results to the output circuitry. In one embodiment, this output circuitry first adjusts for offset in the OFFSET SUBTRACTOR, then employs averaging if so configured in the AVERAGER, and then formats the data in the appropriate manner in the FORMATTING circuit. These circuits may be controlled by software configuration (ADCOFS, AVGE and AVGS, and MODE and DIFFn, respectively). The offset value OFS used by the OFFSET SUBTRACTOR, as well as the configuration values PG, MG, CLPx, and CLMx, may be created before conversion by the calibration control circuitry 66. Once formatted the result is compared to a compare value (CV1) or range (CV1, CV2) in the COMPARE LOGIC. Based on the software configuration to the COMPARE LOGIC (ACFE, ACFGT, ACREN) the comparator will transfer the result to the result registers (ADCRHA:ADCRLA to ADCRHN:ADCRLN) and set COMPARE_TRUE. In one embodiment, the conversion trigger logic and SAR control circuitry 76 will then determine, based on software configuration (ADCO), whether to begin another conversion or to ABORT the sequence and turn the SAR converter off. Alternate embodiments of the data converter 12 of FIG. 2 may use more, less, or different circuitry to implement circuitry for performing data conversion.

Figure 3:
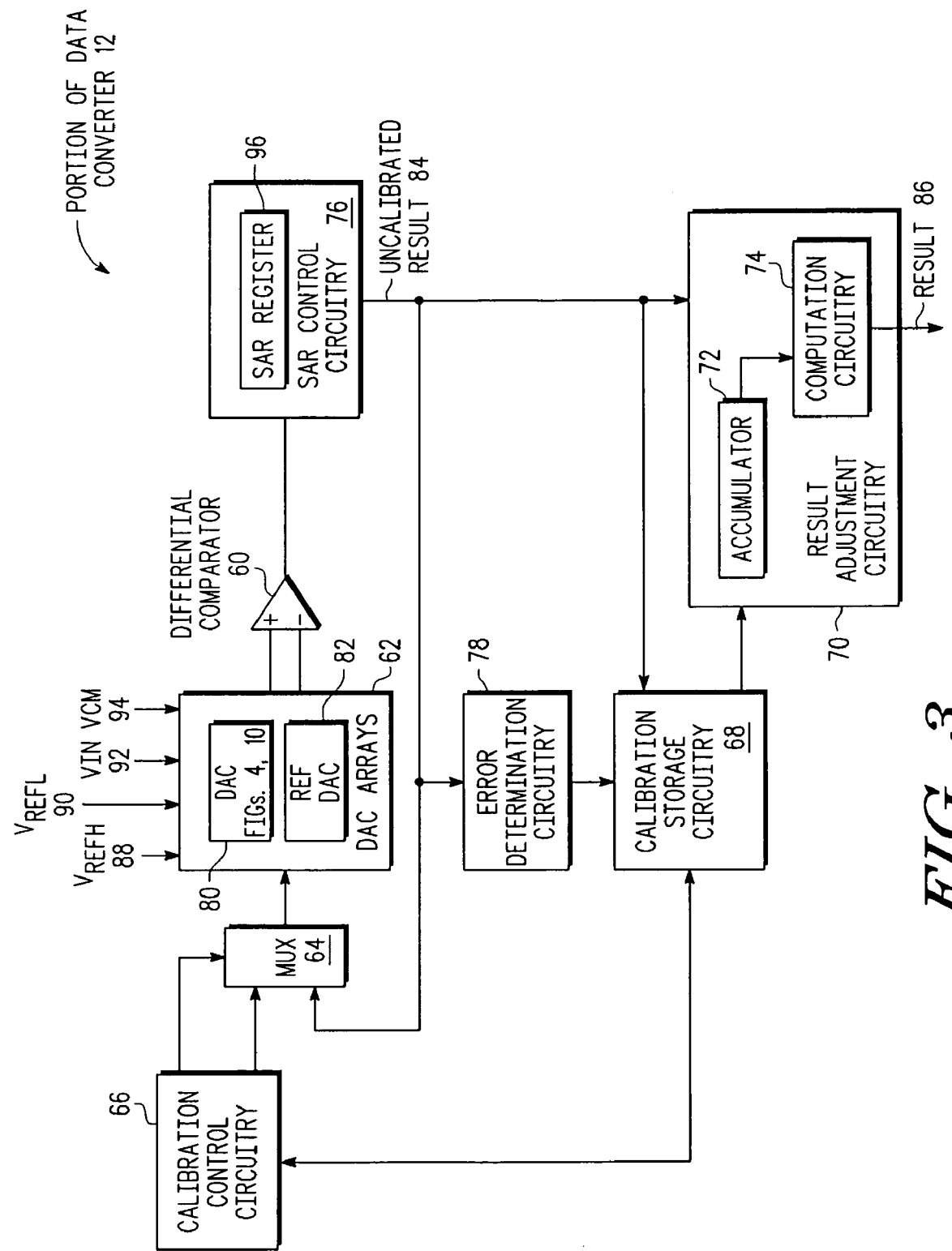
FIG. 3 illustrates, in partial block diagram form and partial schematic diagram form, a portion of a data converter in accordance with one embodiment.

FIG. 3 illustrates one embodiment of a portion of data converter 12 of FIG. 1. Referring to FIG. 3, the illustrated successive approximation (SAR) analog-to-digital converter (ADC or A/D converter) comprises a digital-to-analog converter (DAC) 62 and a comparator 60 in a feedback loop with logic including a successive-approximation (SAR) register 96. In one embodiment, DAC 62 comprises an array of binary weighted elements (e.g. capacitors 110-119 of FIG. 4). Alternate embodiments may use any type of charge redistribution array for data conversion. In addition, alternate embodiments may use any desired and appropriate binary weighted elements (e.g. resistive elements, capacitive elements, a combination thereof, etc.). Note that "N", "M", and "P" are being used to represent integers. For example, "bN" is the "nth bit" or "bit N"; similarly "b(N+M+P)" is the "(N+M+P)th bit" or "bit (N+M+P)".

During a conversion, a voltage input VIN 92 is sampled onto the DAC 62; then during a compare phase the DAC capacitors 110-119 are controlled to successively approximate the input voltage VIN 92 using the comparator 60 output to make decisions on how to switch the capacitors 110-119. At each step of the approximation, the comparator 60 output is stored in the SAR register 96 and the resulting digital word (uncalibrated result 84) is the digital representation of the analog input voltage VIN 92.

As the resolution of an SAR ADC 12 (see FIG. 2) increases, one of the major limitations is element matching within one or more of the DAC arrays 62. In general, matching beyond 10-12 bits is not generally feasible within reasonable cost constraints. An added limitation to high-resolution SAR ADCs may be the use of one or more scaling capacitors (e.g. 121, 120 of FIG. 4) to limit the number of overall DAC capacitors 110-119. These scaling capacitors 121, 120 are non-unit size and have associated parasitics that may cause further mismatching in DAC arrays 62.

In one embodiment, a self-calibration sequence (e.g. method 150 of FIG. 5) is used to generate and store calibration values (e.g. stored in calibration storage circuitry 68). These calibration values can then be digitally combined with an uncalibrated result 84 (see FIG. 3) during a conversion sequence (e.g. flow 170 of FIG. 6) to produce a calibrated result 86. In one embodiment, the self-calibration sequence (e.g. flow 150 of FIG. 5) involves sampling the high reference voltage (VREFH) on selected ones of capacitors 110-119 and sampling the low reference voltage (VREFL) on other selected ones of capacitors 110-119. The voltages VREFH and VREFL are then switched, causing an error voltage which is measured by successive approximation using standard functionality of the ADC. Although the embodiment of method 150 of FIG. 5 has been illustrated as having steps 140-147, alternate embodiments may have more, fewer, or different steps than those illustrated in FIG. 5. Also, although the embodiment of method 170 of FIG. 6 has been illustrated as having steps 160-167, alternate embodiments may have more, fewer, or different steps than those illustrated in FIG. 6.

Figure 4:
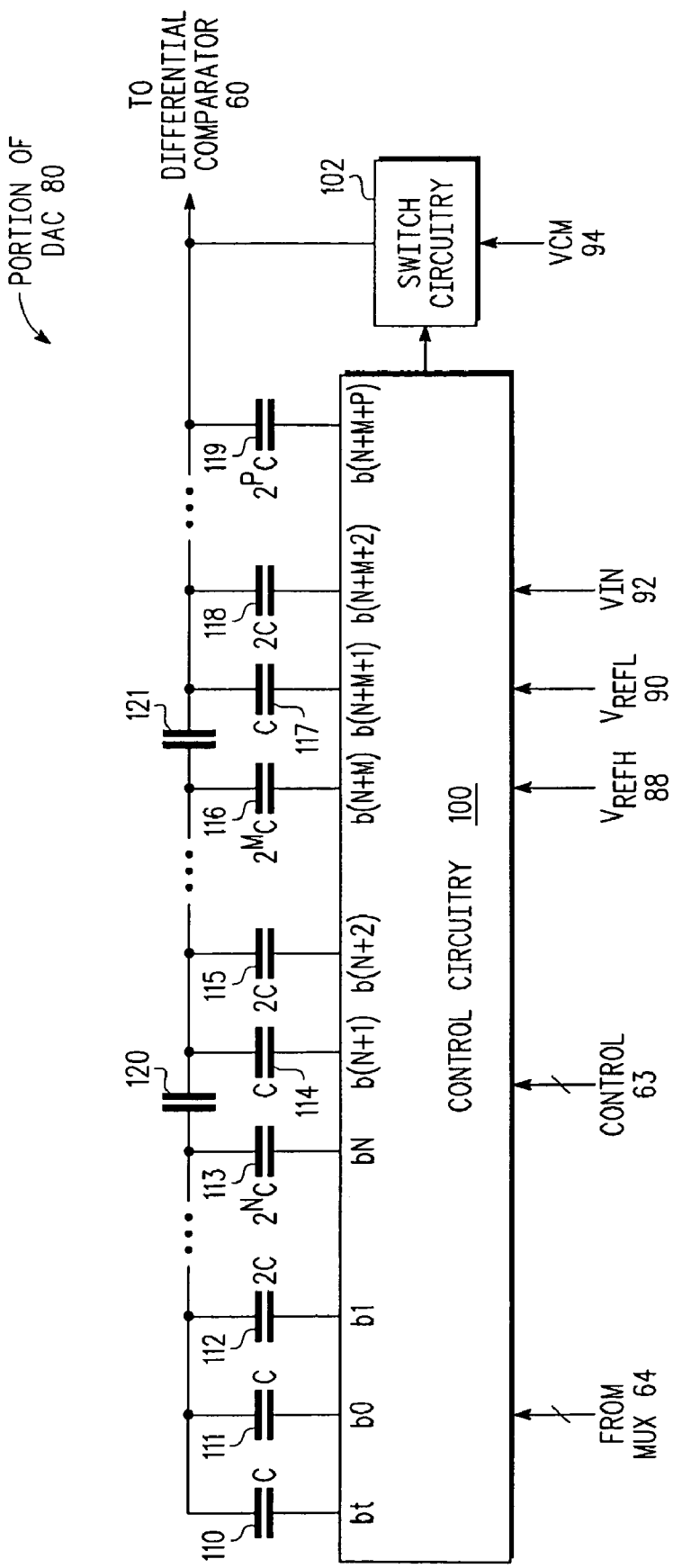
FIG. 4 illustrates, in partial block diagram form and partial schematic diagram form, a portion of a DAC in accordance with one embodiment.

In the portion of DAC 80 illustrated in FIG. 4, there are three sections or portions separated by two scaling capacitors 121 and 120. In one embodiment, the size or capacitance of scaling capacitor 121 is increased such that it is larger than the largest possible cumulative mismatch of capacitors 117-119 in the most significant portion. The largest possible cumulative mismatch of capacitors 117-119 in the most significant portion may be determined based on the process variations in the manufacturing processes used to make DAC 80. Alternate embodiments of DAC 80 may use any number of scaling capacitors 121, 120. Although the portion of DAC 80 illustrated in FIG. 4 has three sections, alternate embodiments may have any number of sections. In addition, each section may have any desired and appropriate number of capacitors. In the illustrated embodiment, the first section comprises capacitors 117-119, the second section comprises capacitors 114-116, and the third section comprises capacitors 110-113.

Figure 5:
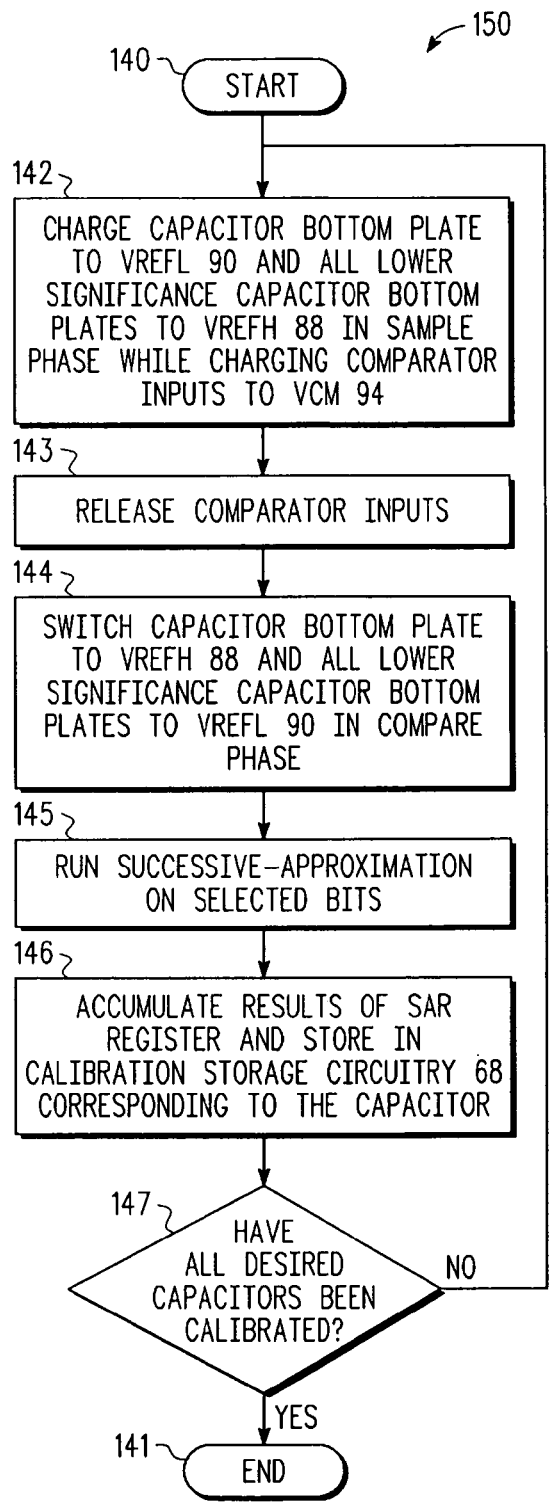
FIG. 5 illustrates, in flow diagram form, a sample calibration method in accordance with one embodiment.
Figure 6:
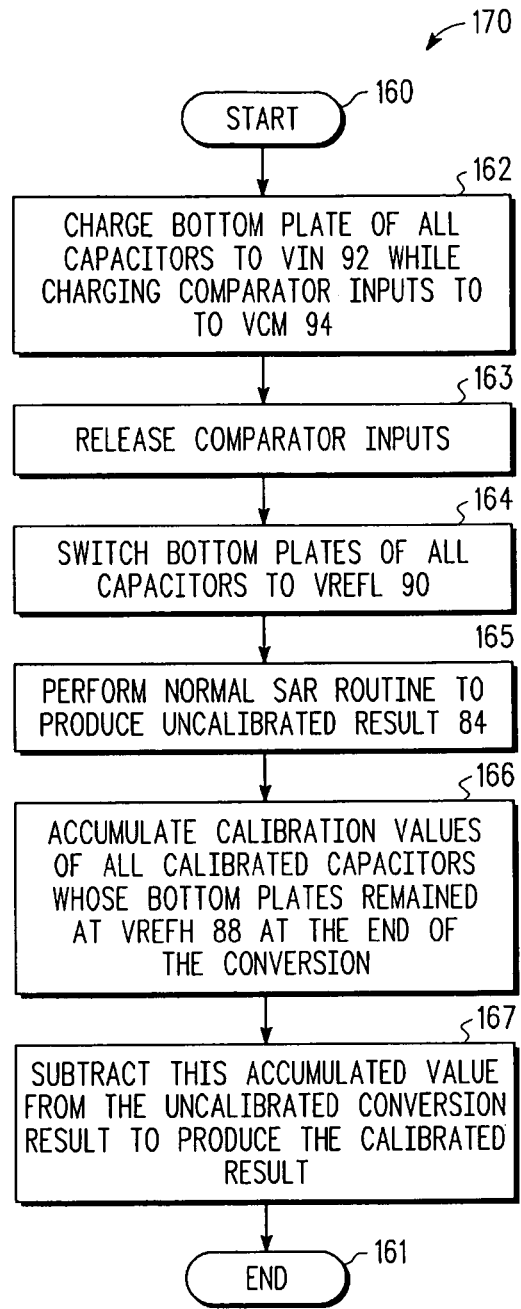
FIG. 6 illustrates, in flow diagram form, a sample conversion method in accordance with one embodiment.

Referring to FIG. 5, the flow 150 describes a method for determining one or more calibration values that can be used to compensate for one or more errors in the capacitor values relative to the ideal values. These errors may be due to process variation during manufacturing or other factors and may cause errors in the result value produced by the conversion. The process starts with the capacitors representing the most significant bit (MSB) and proceeds to determine calibration values for as many of the conversion bits as is desired. In one embodiment, the number of bits which are calibrated is a function of the worst case mismatch between capacitor values in the DAC arrays 62 (see FIG. 3) and the resolution of the ADC. As an example, for an 8-bit ADC, a transition from $7F to $80 represents a voltage step of $1/128^{th}$ of the reference voltage step if the capacitors have their ideal values. If the MSB capacitor mismatches the sum of the least significant bit (LSB) capacitors by more than $1/128^{th}$, then a conversion error will result. The conversion error could either be a non-monotinicity (same code for two different voltage ranges), or a missing code (where no input voltage produces that particular code) (see FIG. 7 prior art). If the worst case mismatch is greater than $1/128^{th}$ of the reference voltage step, then calibration of that MSB capacitor may be necessary to produce accurate conversions over the entire manufacturing process window. Note that for one embodiment, namely the illustrated embodiment, the calibration process starts with the capacitors associated with the MSB as the current capacitors being calibrated; determines a calibration value for those capacitors; determines if there is a need to calibrate more capacitors; and if there is, the calibration process is repeated using the capacitors of the next lower bit.

Figure 7:
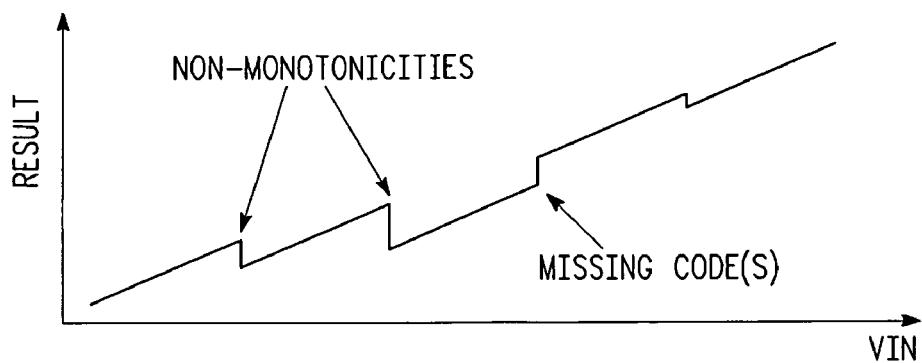
FIG. 7 illustrates, in graphical diagram form, nonlinearities due to capacitor mismatch in a binary-weighted DAC in accordance with the prior art.

The non-monotinicities and the missing codes in FIG. 7 (prior art) are caused by switching from one combination of values of higher order bits (the ones that have been calibrated) to a different combination of values of higher order bits. There is a disadvantage to allowing non-monotinicities. The problem with non-monotinicities is that the same conversion result can occur with two different value ranges of VIN 92, thus making it difficult for result adjustment circuitry 70 to properly adjust the result. In one embodiment (see FIG. 8), non-monotinicities are eliminated by ensuring that the sum of the capacitors of the remaining bits (i.e. the capacitors below the current bit being calibrated) have a sum greater than the capacitor associated with the current bit being calibrated. One embodiment for ensuring that such non-monotinicities are eliminated is to place a scaling capacitor having a sufficiently large capacitance (e.g. 120 and/or 121 of FIG. 4; and/or 220 and/or 221 of FIG. 10) between the lowest bit to be calibrated and all lower bits. In one embodiment, the scaling capacitor is sized so that the effective capacitance of the sum of capacitors for the lower bits is guaranteed to be greater than the capacitance of the bit that is being calibrated. Alternately, the effective capacitance may be increased by increasing the sum of capacitors for the lower bits. In yet other embodiment, a combination of increasing the scaling capacitor and increasing the sum of capacitors for the lower bits may be used. If any of these techniques are used, an uncalibrated result 84 (see FIG. 3) is produced which has no non-monotinicities (see FIG. 8). Thus there will always be only one uncalibrated result value 84 for each value of VIN 92; and thus the adjustment performed by result adjustment circuitry 70 (see FIG. 3) can be a straightforward linear adjustment.

Referring to FIG. 4, alternate embodiments of DAC 80 may have only scaling capacitor 121, may have both scaling capacitors 121 and 120, or may have scaling capacitors 121, 120, as well as one or more additional scaling capacitors (not shown) for one or more added portions of DAC 80 coupled between capacitors 110-112 and capacitors 113-115, where the one or more additional scaling capacitors may be coupled in the same manner as capacitors 120 and 121. Note that merely having scaling capacitors (e.g. 121, 120) is not sufficient to guarantee no non-monotinicities (see FIG. 8); it is also necessary to have one or more scaling capacitors (e.g. 121, 120) that have sufficiently large capacitance values in conjunction with the effective capacitance of the sum of capacitors for the lower bits (e.g. 110-112).

Figure 8:
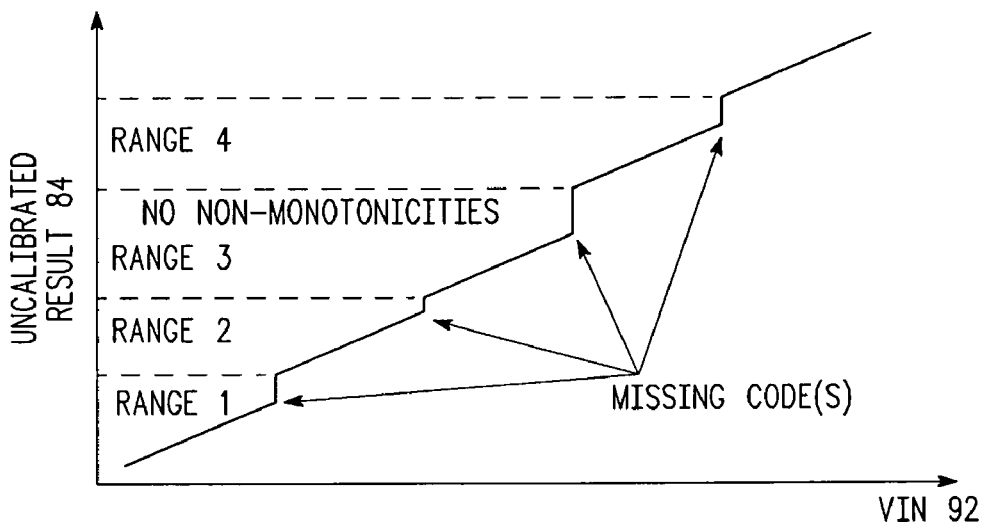
FIG. 8 illustrates, in graphical diagram form, nonlinearities due to capacitor mismatch in a binary-weighted DAC with oversized first scaling capacitor in accordance with one embodiment.
Figure 9:
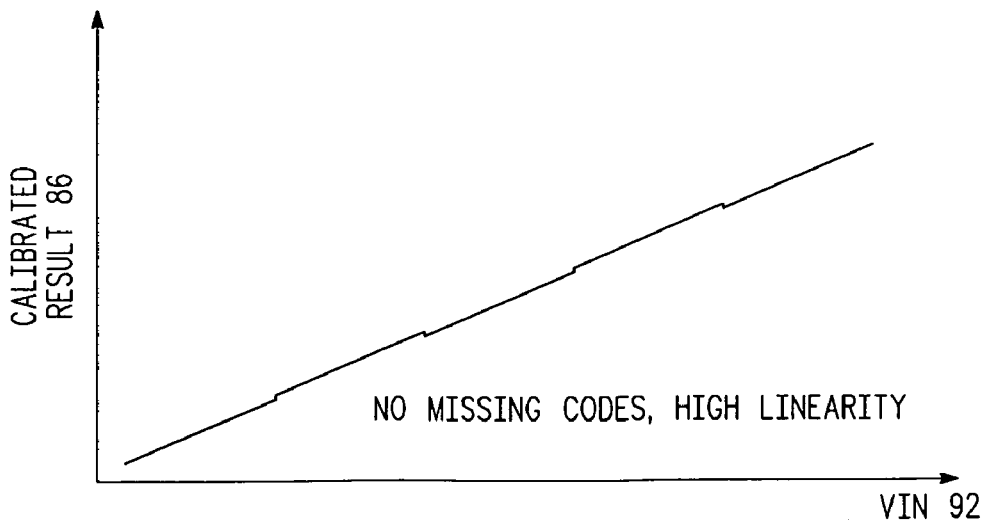
FIG. 9 illustrates, in graphical diagram form, nonlinearities due to capacitor mismatch in a binary-weighted DAC with oversized first scaling capacitor after calibration in accordance with one embodiment.

Referring to FIG. 9, by storing calibration values for selected VIN 92 values, and making calibration adjustments to the uncalibrated result 84 when appropriate, it is possible to produce an approximately linear relationship between VIN 92 and the calibrated result 86 (see FIG. 9). In one embodiment, a plurality of calibration values are determined (e.g. by using the method described in FIG. 5) and are stored in calibration storage circuitry 68 (see FIG. 3). In one embodiment, one or more MSBs of the uncalibrated result 84 are used to select the appropriate calibration value(s) (e.g. the MSBs may be used as an index into a memory in calibration storage circuitry 68). Referring to FIG. 8, the MSBs of the uncalibrated result 84 determine which range (e.g. range 1 through range 4 illustrated in FIG. 8) is appropriate. Each range (range 1 through 4 of FIG. 8) has a corresponding calibration value. In one embodiment, this calibration value is used by result adjustment circuitry 70 to adjust the uncalibrated result 84 to produce the calibrated result 86. In alternate embodiments, the result adjustment circuitry 70 may function in a different manner and/or may adjust the uncalibrated result 84 in a different manner. The manner described herein is just one possible implementation.

In one embodiment, a different calibration value is stored for each calibrated bit during a calibration sequence (see FIG.

5). This calibration value represents the accumulation of the errors for that bit's capacitor compared to the sum of all lower significant capacitors. The accumulation is performed during calibration and is represented and stored as part of the calibration values. The calibration value A(n) for a given bit is given by the formula A(n)=S(n)+A(n−1)+A(n−2)+ . . . A(1) where S(n) is the SAR result describe in FIG. 5. The number of calibration values in this embodiment is equal to the number of bits whose capacitors are being calibrated. Note that accumulator 72 may be used to perform this summation or accumulation. After data conversion, result adjustment circuitry 70 accumulates the calibration values corresponding to the appropriate bits determined by the MSBs of the uncalibrated result 84 and subtracts the accumulated calibration values from the uncalibrated result 84 to produce the calibrated result 86. In an alternate embodiment, the accumulation may be performed during data conversion as MSBs are set using accumulator 72. In this alternate embodiment, only a single subtraction computation would be required after data conversion.

In another embodiment, a different calibration value is stored for each range (see FIG. 8) during a calibration sequence. In this embodiment, the calibration sequence differs slightly from that shown in FIG. 5. Rather than charging all lower significance capacitor bottom plates to VREFH in step 142, only the bottom plates of capacitors less significant than the last capacitor to be calibrated (e.g. capacitor 217 in FIG. 10) are charged to VREFH. Similarly, in step 144 only the bottom plates of capacitors less significant than the last capacitor to be calibrated are switched to VREFL. In this embodiment, the SAR result is stored directly (no accumulation in step 146) and the number of calibration values is $2^X$ where X is the number of bits being calibrated. After data conversion, result adjustment circuitry 70 receives the calibration values corresponding to the appropriate range determined by the MSBs of the uncalibrated result 84, accumulates these values, and subtracts the accumulated value from the uncalibrated result 84 to produce the calibrated result 86. In an alternate embodiment, the accumulation may be performed during conversion as MSBs are set using accumulator 72.

Referring to FIG. 3, in one embodiment, error determination circuitry 78 may be used to modify the uncalibrated result 84 prior to storing it in calibration storage circuitry 68 as the calibration value. Alternate embodiments may not have or use error determination circuitry 78, and thus may not modify the uncalibrated result 84 prior to storing it in calibration storage circuitry 68. Yet other embodiments may use accumulator 72 to accumulate a running sum of the calibration values for each range (see FIG. 8) so that each new calibration value stored in calibration storage circuitry 68 is a sum of the uncalibrated result 84 and the accumulator value.

The methods and apparatus described in FIGS. 1-9 are applicable to any type of data converter or any type of charge redistribution array used for data conversion, including, as examples, both double-ended, single-ended and differential ADCs, and D/A converters. For example, for embodiments using a differential ADC, the circuitry of FIG. 4 may be used to provide the inputs for both the positive and negative inputs of differential comparator 60 of FIG. 3. The methods of FIGS. 5 and 6 would be used for both sides of a differential ADC. If a differential ADC is used, DAC arrays 62 of FIG. 3 would have a second DAC (e.g. the same as DAC 80) in place of reference DAC 82. This second DAC would receive a second input voltage VIN 93 (see FIG. 2). Note that reference DAC 82 may not be used in some embodiments (e.g. some single-ended ADCs).

Referring to FIG. 5, in one embodiment, the sample phase and the compare phase may be implemented in a wide variety of ways. In FIG. 4, switch circuitry 102 and each capacitor 110-119 receive control information from control circuitry 100 which indicates whether the current phase is a sample phase or a compare phase. Control circuitry 100 is used to couple and decouple the bottom plates of selected ones of capacitors 110-119 to selected reference voltages during both the sample phase and the compare phase in a calibration flow (see FIG. 5). Control circuitry 100 is used to couple the bottom plates of selected ones of capacitors 110-119 to VIN 92 during the sample phase in a conversion flow (see FIG. 6). Control circuitry 100 is used to couple and decouple the bottom plates of selected ones of capacitors 110-119 to selected reference voltages during the compare phase in a conversion flow (see FIG. 6).

Note that for one embodiment, VREFL 90 refers to a first reference voltage that has a lower potential than VREFH 88, and VREFH 88 refers to a second reference voltage that has a higher potential than VREFL 90. VREFH 88 and VREFL 90 are two voltages that are not identical and their use in data conversions is well known in the art. In one embodiment, VCM 94 is the common mode input voltage of differential comparator 60.

Referring to FIGS. 3 and 4, in one embodiment, MUX 64 provides the control inputs to control circuitry 100. Calibration control circuitry 66 controls whether the source of the control inputs is from calibration control circuitry 66 (e.g. during calibration, see FIG. 5), or from SAR control circuitry 76 (e.g. during conversion, see FIG. 6). In one embodiment, calibration control circuitry 66 may be implemented as a state machine. In alternate embodiments, calibration control circuitry 66 may be implemented as combinational logic, or using any desired and appropriate circuitry. Similarly, SAR control circuitry 76 may be implemented as a state machine, combinational logic, or any desired and appropriate circuitry. In some embodiments, SAR control circuitry may have one or more registers 96. Calibration storage circuitry 68 may be implemented using any type of storage circuitry. Result adjustment circuitry 74 may be implemented using an accumulator 72 and computation circuitry 74 coupled as illustrated in FIG. 3. In alternate embodiments, computation circuitry 74 may comprise circuitry for subtracting. In alternate embodiments, computation circuitry 74 may be implemented in any desired and appropriate manner. Differential comparator 60 may likewise be implemented using any circuitry that performs a comparison between differential input signals. FIGS. 3 and 4 illustrate an example of circuitry that may be used to implement various embodiments of the flows of FIG. 5 and FIG. 6; however, there are many possible alternate circuits that may be used to implement various embodiments of the flows of FIG. 5 and FIG. 6. In addition, based on FIGS. 1-9 and the description herein, one of average skill in the art would be able to design the circuitry needed to implement the flows of FIG. 5 and FIG. 6.

Referring to FIG. 3, successive-approximation analog-to-digital converters (SAR ADCs) typically consist of a digital-to-analog converter (e.g. DAC 62) and a comparator (e.g. 60) in a feedback loop with circuitry including a successive-approximation register (e.g. 96). In one embodiment, DAC 62 comprises an array of binary weighted elements (e.g. capacitors 208-219 of FIG. 10). Alternate embodiments may use any type of charge redistribution array for data conversion. In addition, alternate embodiments may use any desired and appropriate binary weighted elements (e.g. resistive elements, capacitive elements, a combination thereof, etc.).

To increase the accuracy of data converter 12 (see FIG. 1), it is useful for data converter 12 to use some form of digital calibration (e.g. linearity, gain and/or offset calibration). Many calibration methods have the undesirable side-effect of reducing the ADC input range. Specifically, many systems that calibrate offset, gain, or linearity by digitally adjusting the conversion result have the undesirable side-effect of reducing the ADC input range. For some ADCs, for example for a general purpose ADC, having a limited or reduced input range is often detrimental because applications exist that want to use both extremes of the input range. Thus a method and circuitry which maintains the full input range of a data converter 12 (e.g. an SAR ADC) is desirable. In addition, it is very advantageous for the method and circuitry to consume as little power as possible, to require as little circuitry and semi-conductor area as possible, and to reduce the conversion speed as little as possible.

Figure 10:
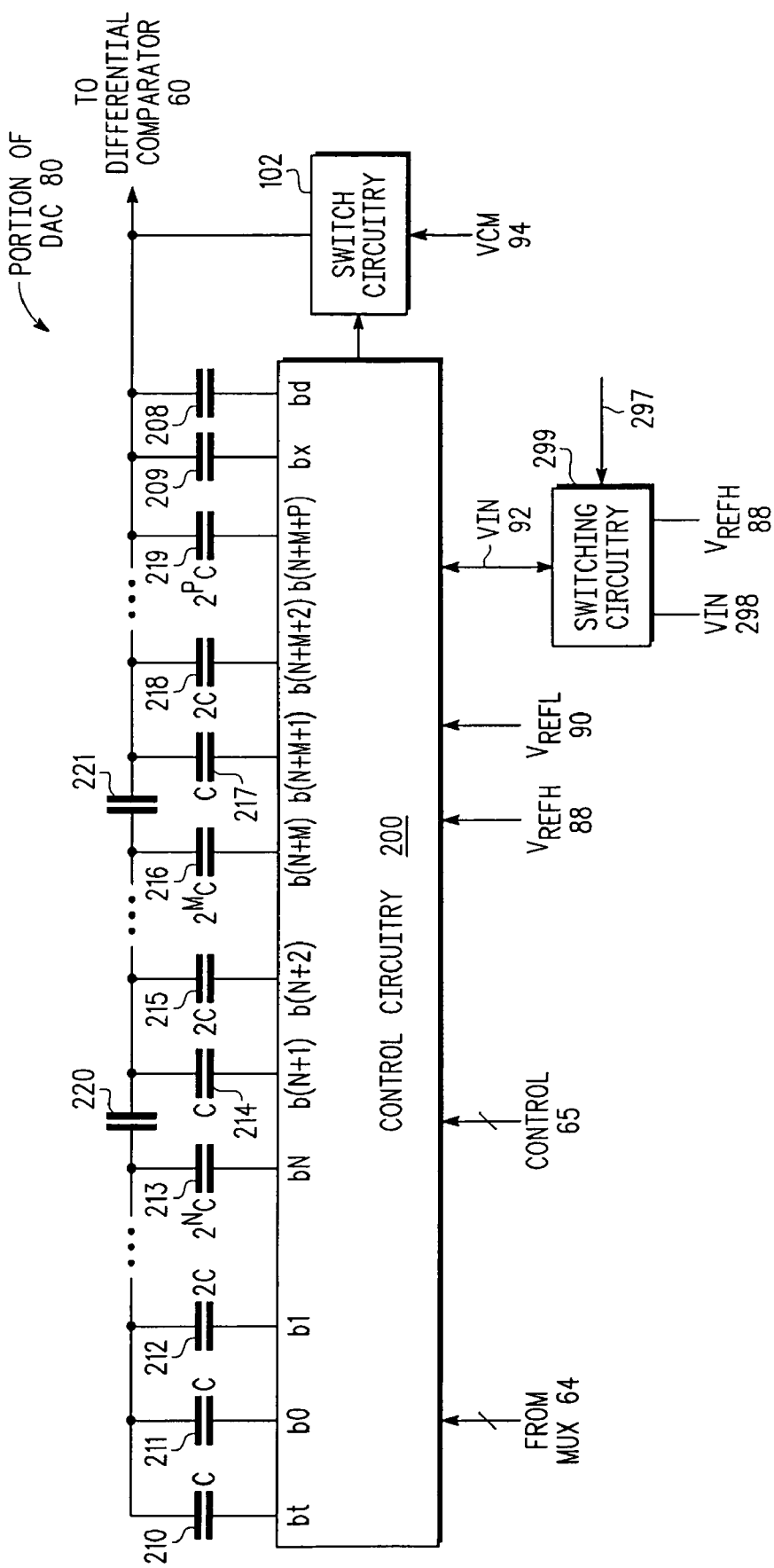
FIG. 10 illustrates, in partial block diagram form and partial schematic diagram form, a portion of a DAC in accordance with one embodiment.

Referring to FIG. 10, in one embodiment of DAC 80 (see FIG. 3), DAC 80 comprises capacitors 210-219 that may function in a similar manner to capacitors 110-119 of FIG. 4. The embodiment of DAC 80 illustrated in FIG. 10 also comprises a capacitor 208 and a capacitor 209. In addition, data converter 12 may comprise switching circuitry 299 which uses a control signal 297 to select whether VIN 298 or VREFH 88 is provided to control circuitry 200 as the VIN signal 92. In alternate embodiments, switching circuitry 299 may be located anywhere in data converter 12, or may alternately not be used if there is no choice for VIN 92. In one embodiment, control circuitry 200 may function in a similar manner to the control circuitry 100 of FIG. 4, with the exception that the control circuitry 200 of FIG. 10 implements a method 271 of FIG. 11 and controls the coupling of one or more of capacitors 208 and 209. Alternate embodiments of DAC 80 may comprise capacitor 208 and not capacitor 209, may comprise capacitor 209 and not capacitor 208, or alternately may comprise both capacitor 208 and capacitor 209. In addition, in alternate embodiments, the capacitance of either or both of capacitors 208 and/or 209 may be implemented using a plurality of capacitors.

Figure 11:
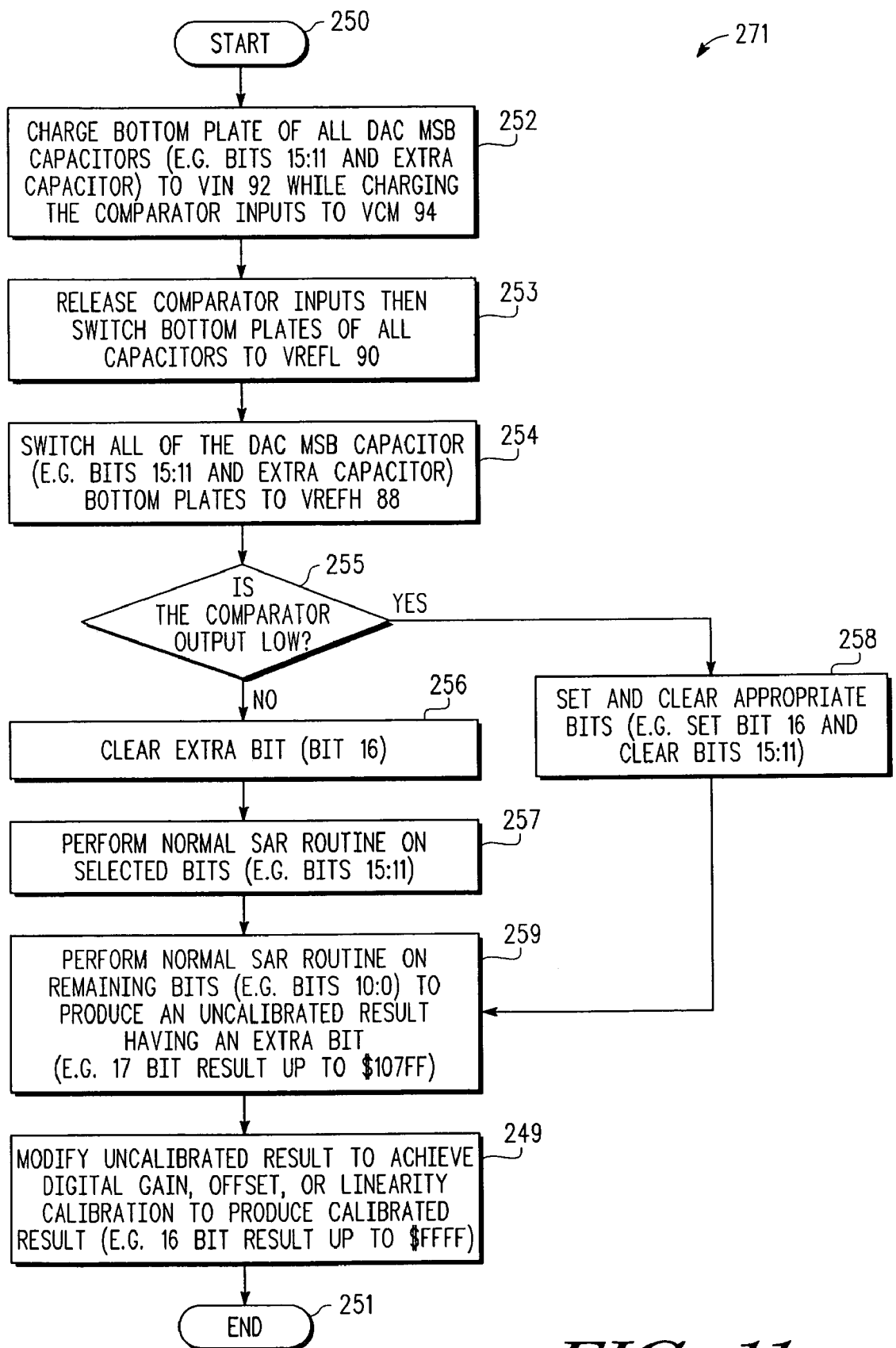
FIG. 11 illustrates, in flow diagram form, a sample conversion method for a 16-bit analog to digital converter (ADC) in accordance with one embodiment.

Referring to FIG. 11, method 271 illustrates a sample conversion sequence for a 16-bit analog to digital converter (ADC). Also, although the embodiment of method 271 of FIG. 11 has been illustrated as having steps 249-259, alternate embodiments may have more, fewer, or different steps than those illustrated in FIG. 11. In addition, although method 271 has been illustrated in the context of a 16-bit ADC, alternate embodiments may have any desired and appropriate number of bits in the conversion result.

Note that various methods for determining the capacitance values of capacitors 210-219 for a successive-approximation ADC is well known in the art and will not be described further herein. However, in the embodiment illustrated in FIG. 10, an extra capacitor 209 is added that is equal in size (i.e. capacitance value) to a capacitor corresponding to bit N+M+1. Thus, for the illustrated embodiment, the capacitance value of capacitor 209 is approximately equal to the sum of all lower significant capacitors (210-216), including the termination capacitor 210. In alternate embodiments, the placement of capacitor 209 may be different, and the placement of capacitor 209 may be determined by how much input range needs to be recovered after calibration.

In one embodiment, an extra successive-approximation step is added which involves creating an extra bit that is more significant than the MSB. For example, a 16-bit result (bits 0-15) would now be 17 bits (bits 0-16) prior to calibration. In a standard SAR sequence, the first conversion step 254 would switch the MSB capacitor to VREFH 88, creating a (VREFH-VREFL)/2 voltage step at the comparator 60 input (see FIG. 3). However, in the embodiment illustrated in method 271 of FIG. 11, after initialization steps 252 and 253, the equivalent of all bits (MSB through bit N+M+1 plus an extra capacitor 209) are first switched to VREFH 88 to create a (VREFH-VREFL) voltage step at the comparator 60 input. If the resultant comparison is low (YES path from step 255, step 258 performed), all capacitors 217-219 plus capacitor 209 are left at VREFH 88, the extra bit of the conversion result is set, the MSB through bit N+M+1 are cleared, and the next approximation moves to bit N+M, followed by the other remaining bits (step 259). However, if the comparison is high (NO path from step 255), all capacitors 217-219 plus capacitor 209 are switched back to VREFL 90, the extra bit of the conversion result (bit 16) is cleared (step 256), and a standard successive-approximation sequence begins at the MSB bit N+M+P (steps 257, 259).

By using a capacitor 209 (see FIG. 10) having a predetermined value described herein above, and by using steps 254-258 in conversion sequence 271 (see FIG. 11), it is possible to allow an uncalibrated conversion result of greater than full-scale (e.g. a 17 bit conversion result instead of 16 bits). As a result, it is possible for some embodiments of data converter 12 of FIG. 1 to use digital calibration that modifies the uncalibrated conversion result, without causing the final calibrated conversion result to be limited to less than full scale. Referring to the embodiment illustrated in FIG. 11, the extra successive-approximation step (steps 254-257) involves switching the equivalent of all bits (MSB through bit X plus the extra capacitor 209) to VREFH 88 to create a (VREFH-VREFL) voltage step at the comparator 60 input prior to a normal SAR routine. This allows an uncalibrated conversion result of greater than full-scale, and a calibrated conversion result which is not less than full-scale. Note also that adding capacitor 209 and a small amount of control circuitry to control circuitry 200 (as compared to control circuitry 100) would add very little cost and semiconductor area to data converter 12 of FIG. 1.

Figure 12:
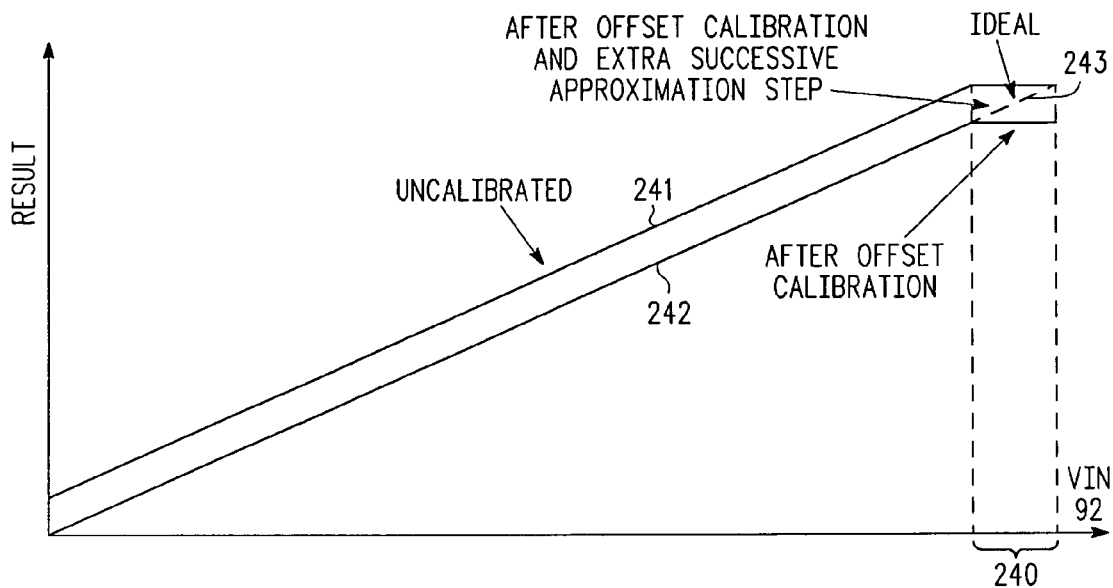
FIG. 12 illustrates, in graphical diagram form, a transfer function of an ADC with digitally calibrated offset in accordance with one embodiment.

FIG. 12 illustrates a transfer function of an ADC (e.g. 12 of FIG. 1) in accordance with one embodiment. Solid line 241 represents the uncalibrated result of one embodiment of ADC 12. Note that range 240 represents the values of VIN 92 that produce the same maximum uncalibrated result value on solid line 241. Solid line 242 represents the calibrated result after the offset calibration has been added or subtracted. Note that subtracting a number may be accomplished by taking a two's complement of a number and adding that number. Adding/subtracting the offset calibration merely shifts the uncalibrated line up or down. Thus range 240 represents the values of VIN 92 that produce the same maximum calibrated result value on solid line 242. In the embodiment illustrated in FIG. 12, the offset is subtracted and the solid uncalibrated line 241 is shifted down to produce the solid calibrated line 242. Note that as a result of subtracting an offset, the ADC input range has been reduced by the amount 240. Thus, for all values of VIN 92 in range 240, the same result value will be produced after offset calibration. In order to increase the ADC input range to include values of VIN 92 in range 240, an extra successive approximation step (see steps 254-258 of FIG. 11) will be performed. Dotted line 243 represents the calibrated result after both the offset calibration and the extra successive approximation are performed. As an example, note that for a 16 bit conversion result, the calibrated conversion result may now have a value up to the ideal maximum of hexadecimal $FFFF. And thus the entire range of VIN 92 values, including those in range 240, will produce the "ideal" and desired calibrated conversion result value 243.

Figure 13:
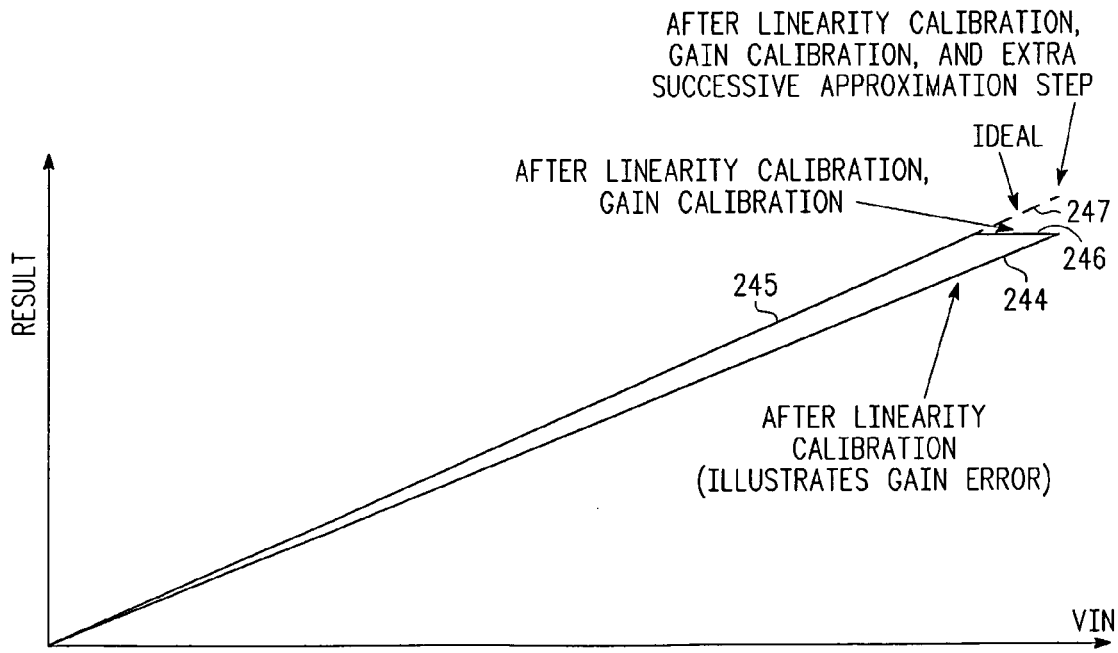
FIG. 13 illustrates, in graphical diagram form, a transfer function of an ADC with digital linearity and gain calibration in accordance with one embodiment.

FIG. 13 illustrates a transfer function of an ADC (e.g. 12 of FIG. 1) with digital linearity and gain calibration in accordance with one embodiment. After the linearity calibration is performed on the uncalibrated conversion result (represented by solid line 244), there remains a gain error (represented by the gap between solid line 244 and solid line 245). This is corrected by sampling more charge. However, correcting the gain error causes a loss of input range at the high end of full scale (represented by solid line 246). In one embodiment, this loss of VIN 92 range is corrected by the use of an extra capacitor 209 (see FIG. 10) and an extra successive approximation (see steps 254-259 in FIG. 11). Note that at least some of the embodiments of the methods and circuitry described in FIGS. 10-13 and the associated text are applicable to SAR-type ADCs, unlike many prior art approaches. In addition, some embodiments described herein very efficiently compensate for the loss of dynamic input range caused by digital gain and offset calibrations in an ADC (e.g. 12 of FIG. 1).

In some applications using a data converter, it is desirable to be able to convert a differential input signal where the polarity of the differential input is unknown. Converting a differential signal also helps increase the accuracy of the result due in part to common-mode noise rejection. However, one of the limiting factors in implementing a differential ADC may be keeping the comparator inputs within the comparator's common mode voltage range during successive approximation. When a comparator is auto-zeroed at a common mode voltage, moving its inputs away from that common mode voltage will cause errors in the conversion result. It would be very advantageous to be able to do differential conversions in a SAR ADC without creating errors and without increasing the size or significantly reducing the speed relative to a single-ended ADC. In one embodiment, circuitry used for data conversion performs a partial single-ended approximation of the ADC minus input followed by the full single-ended approximation of the plus input to get an accurate differential conversion result. Alternate embodiments may operate in a different manner.

Figure 14:
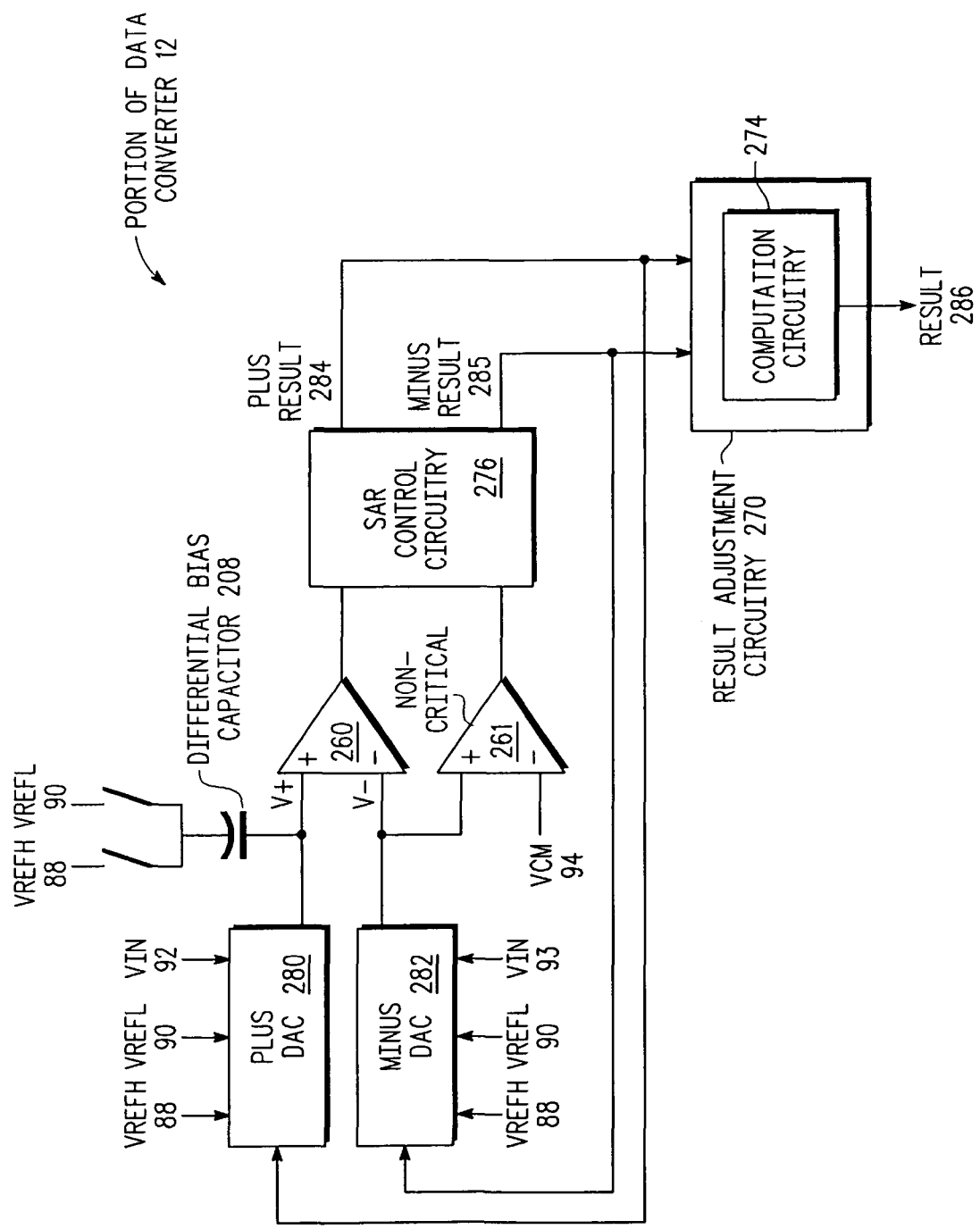
FIG. 14 illustrates, in partial block diagram form and partial schematic diagram form, a portion of a data converter in accordance with one embodiment.

FIG. 14 illustrates one embodiment of a portion of a data converter 12 of FIG. 1. In one embodiment, data converter 12 comprises a successive-approximation analog-to-digital converter (SAR ADC). In alternate embodiments, data converter 12 may be any type of charge redistribution array used for data conversion. In the illustrated embodiment, data converter 12 comprises a plus DAC 280, a minus DAC 282, a comparator 260, a comparator 261, and SAR control circuitry 276. SAR control circuitry 276 receives the output of comparators 260, 261 and provides a plus result 284 and a minus result 285 to result adjustment circuitry 270. In one embodiment, result adjustment circuitry 270 comprises subtractor computation circuitry 274, which provides a result 286. In one embodiment, the minus result 285 is subtracted from the plus result 284 to produce a differential result (308 in FIG. 15). In one embodiment, a fixed and/or predetermined value is subtracted by the computation circuitry 274 after the conversion if the differential bias capacitor 208 was switched (see 305, 306, 309, and 310 in FIG. 15). Alternate embodiments may produce the conversion result 286 in a different manner.

In the embodiment illustrated in FIG. 14, plus DAC 280 receives VREFH 88, VREFL 90, VIN 92, and plus result 284 as inputs. Minus DAC 282 receives VREFH 88, VREFL 90, VIN 93, and minus result 285 as inputs. A first electrode of differential bias capacitor 208 is coupled to either VREFH 88 or VREFL 90. In one embodiment, SAR control circuitry is used to control which voltage is coupled to the first electrode of capacitor 208. In alternate embodiments, any desired and appropriate circuitry may be used to control which reference voltage (e.g. VREFH, VREFL) is coupled to the first electrode of capacitor 208. The second electrode of capacitor 208 is coupled to the output of plus DAC 280 and to the positive input of comparator 260. The output of minus DAC 282 is coupled to the negative input of comparator 260 and to the positive input of comparator 261. The negative input of comparator 261 is coupled to a common mode voltage VCM 94. In one embodiment, plus DAC 280 and minus DAC 282 each comprise an array of binary weighted elements, such as, for example, capacitors or resistors. In one embodiment, SAR control circuitry 276 comprises an SAR register, such as, for example, SAR register 96 in FIG. 3.

Figure 15:
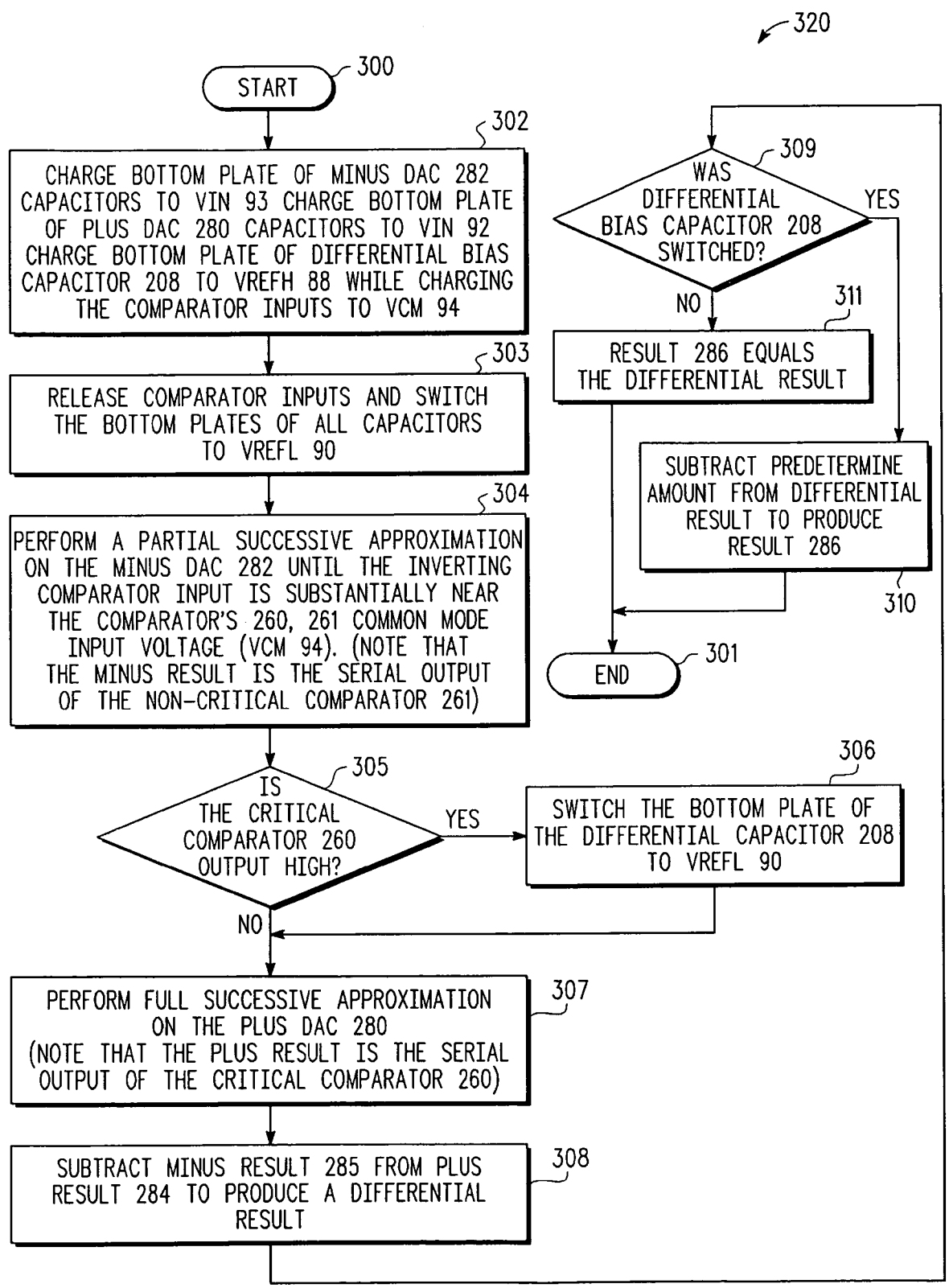
FIG. 15 illustrates, in flow diagram form, a sample differential conversion method in accordance with one embodiment.

FIG. 15 illustrates one method 320 for performing a fully differential conversion in a data converter (e.g. a SAR ADC) without introducing errors from comparator common mode voltage shifts. Referring to FIG. 14, the method 320 accomplishes this by performing a partial successive approximation on the "minus" side (i.e. using minus DAC 282 and comparator 261) sufficient to get the comparator minus input (i.e. the negative input to comparator 260) close to its common mode/auto-zero voltage. This minus result 285 (i.e. the result of the partial successive approximation on the "minus" side) is computed by a non-critical comparator 261. Note that for some embodiments, comparator 261 may be implemented inexpensively as a very simple comparator since small voltage differences do not need to be detected. This "partial successive approximation on the minus side" is then followed by a full single-ended successive approximation on the "plus" side using a more accurate and critical comparator 260, and using plus DAC 280. The differential result is the difference between the plus result 284 and the minus result 285. This differential result may then be adjusted, if desired and appropriate, by result adjustment circuitry 270 to produce result 286. For embodiments in which no adjustment is used, result adjustment circuitry 270 may not be implemented and the differential result may be provided as result 286.

Note that for the embodiment of data converter 12 illustrated in FIG. 14, comparator 261 may be small, low power, and inexpensive because it does not have to resolve a small input voltage. The embodiment illustrated in FIG. 14 also uses a differential bias capacitor 208.

Referring to FIG. 15, method 320 illustrates a sample conversion sequence for a data converter. In one embodiment, the method 320 may be a differential conversion used with the SAR ADC illustrated in FIG. 14. Also, although the embodiment of method 320 of FIG. 15 has been illustrated as having steps 300-311, alternate embodiments may have more, fewer, or different steps than those illustrated in FIG. 15. In addition, although method 320 has been illustrated in the context of a SAR ADC, alternate embodiments may use different types of data converters.

Referring to FIG. 15, Steps 302-304 illustrate a partial successive approximation routine (SAR) performed on the minus DAC 282 (see FIG. 14) to get the minus (or negative) input of comparator 260 sufficiently near its common mode/auto-zero voltage (e.g. VCM 94). Then in decision diamond 305, the output of the more critical comparator 260 is checked (e.g. by SAR control circuitry 276) to determine if the plus (or positive) comparator input to 260 is higher than the minus comparator input to 260 after the partial minus SAR (using minus DAC 282). If the plus input to comparator 260 is higher than the minus input to comparator 260, then the first electrode (e.g. bottom plate) of the differential bias capacitor 208 is switched from VREFH to VREFL (see step 306). This switching allows the plus input to 260 to successfully approximate the minus input to 260 during the subsequent successive approximation using plus DAC 280 and comparator 260 (see step 307). In step 308, the minus result 285 is subtracted from the plus result 284 to produce a differential result. In decision diamond 309, the question is asked "was differential bias capacitor 208 switched?". If the answer is no, then result 286 equals the differential result (see step 311). However, if the answer is yes, then a predetermined value is subtracted from the differential result in order to produce result 286 (see step 310).

Note that in one embodiment, capacitor 208 is approximately equal in size to the last capacitor used in the minus side approximation which utilizes minus DAC 282. The last capacitor used is determined by the number of approximations in the minus side partial successive approximation. The number of approximations may be chosen such that errors caused by comparator 260 due to the common mode voltage shift do not significantly degrade the accuracy of data converter 12. If comparator 260 has a high common mode rejection ratio, fewer approximations will be required on the minus DAC 282. Alternate embodiments may use any desired and appropriate value for capacitor 208. In addition, alternate embodiments may use a plurality of capacitors in place of capacitor 208. Yet other embodiments may us any appropriate and desired circuit elements in addition to or in place of capacitor 208. Although capacitor 208 has been illustrated in FIG. 14 as not being part of DAC 280, alternate embodiments may include capacitor 208 as part of DAC 280. For example, the portion of DAC 80 illustrated in FIG. 10 may comprise a differential bias capacitor 208 which may or may not be considered as part of DAC 80.

Figure 16:
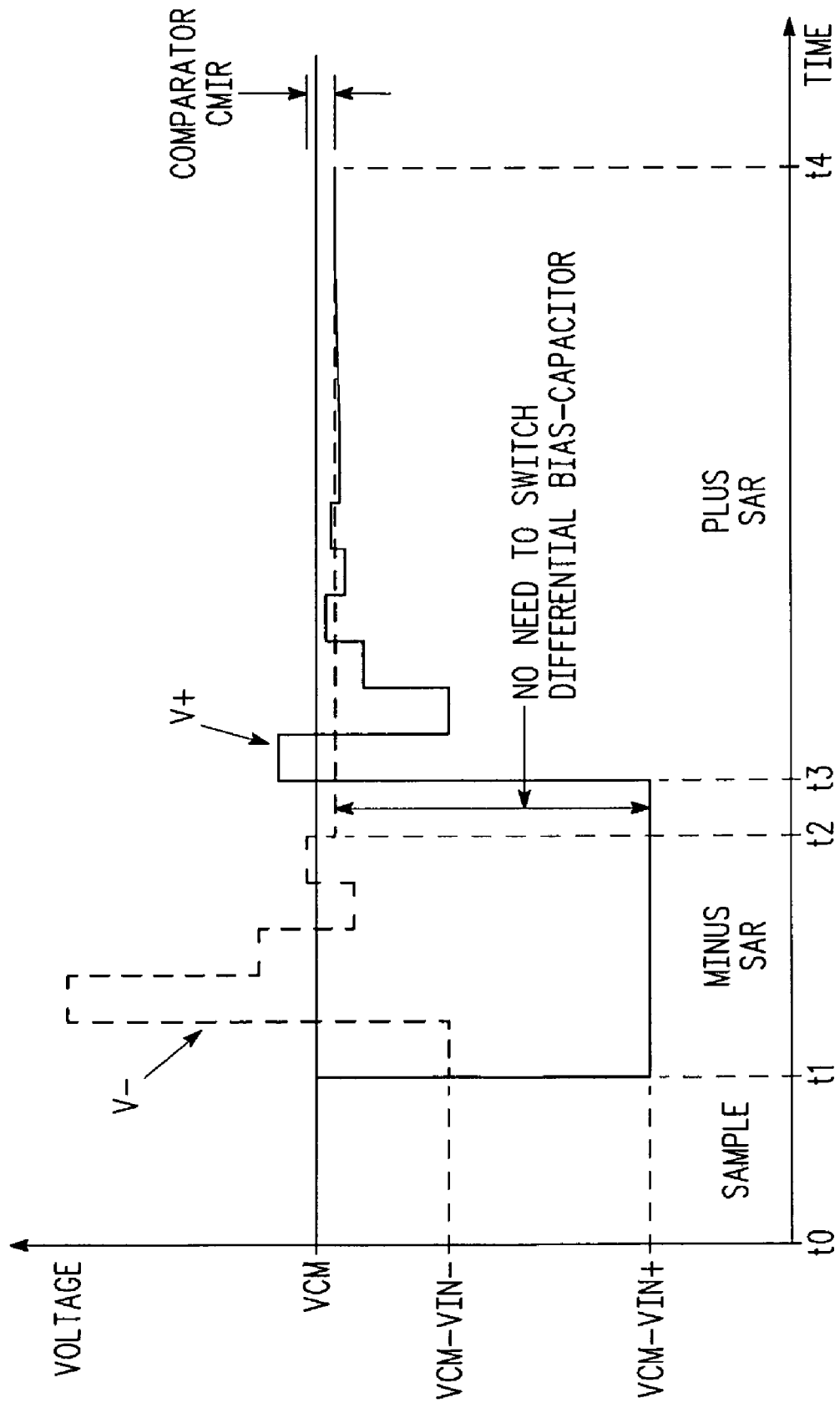
FIG. 16 illustrates, in graphical diagram form, an example of a differential conversion in accordance with one embodiment.

FIG. 16 illustrates an example of a case where V+ (the voltage at the plus input of comparator 260 of FIG. 14) is less than V− (the voltage at the minus input of comparator 260) after the partial successive approximation (step 304 of FIG. 15) using minus DAC 282 and comparator 261. For the example illustrated in FIG. 16, since V+ is less than V−, it is not necessary to switch the differential bias capacitor 208 (i.e. to have its first electrode coupled to the lower reference voltage (VREFL 90) rather than the higher reference voltage (VREFH 88)) in order for V+ to approximate V−.

Figure 17:
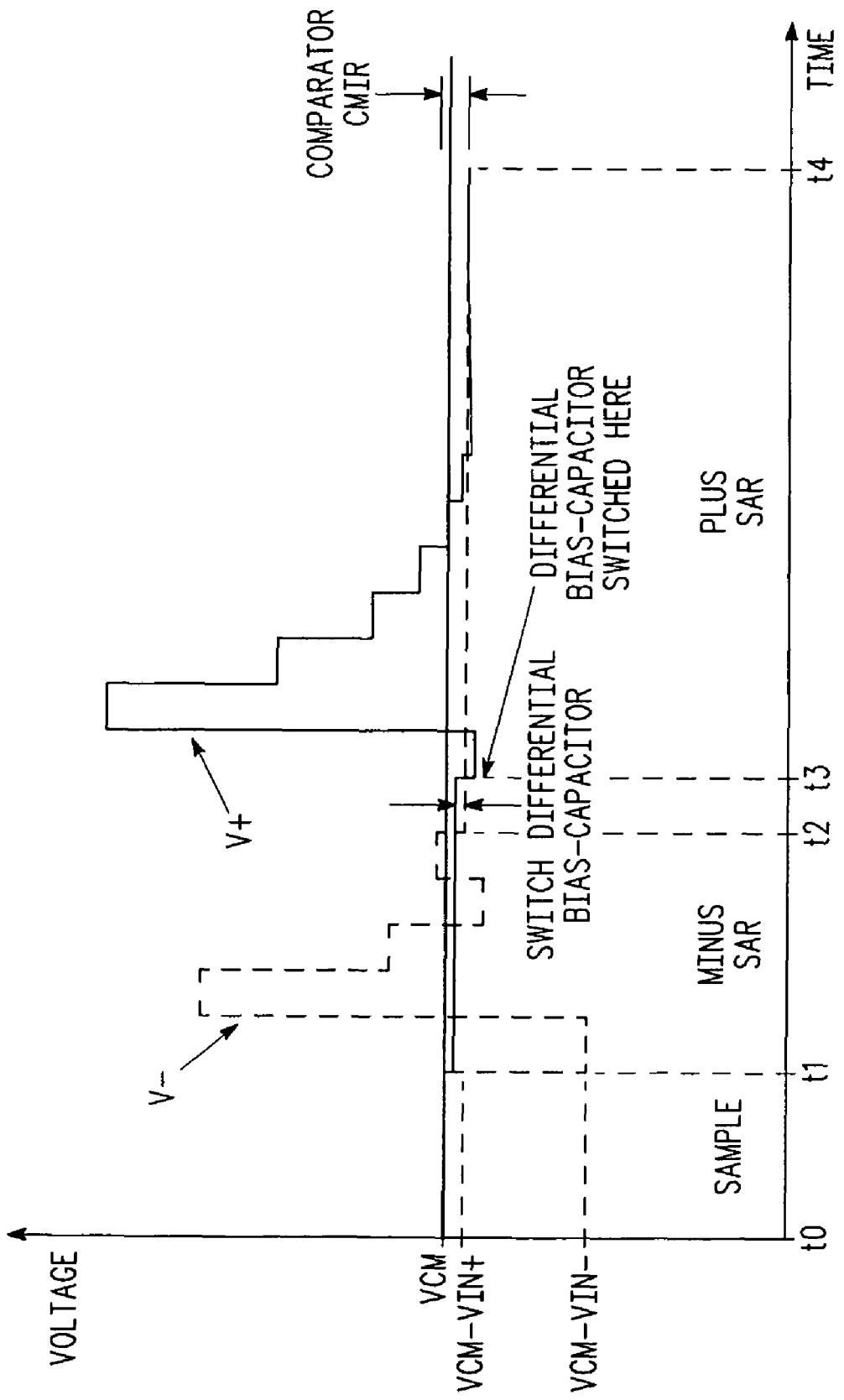
FIG. 17 illustrates, in graphical diagram form, another example of a differential conversion in accordance with one embodiment.

FIG. 17 illustrates an example of a case where V+ (the voltage at the plus input of comparator 260 of FIG. 14) is greater than V− (the voltage at the minus input of comparator 260) after the partial successive approximation (step 304 of FIG. 15) using minus DAC 282 and comparator 261. Because V+ is greater than V−, the differential bias capacitor 208 is switched from having its first electrode coupled to VREFH 88 to having its first electrode coupled to VREFL 90 in order to lower V+ and allow approximation to V−. Note that FIGS. 16 and 17 are merely intended as illustrative examples. Alternate embodiments of various data converter circuits (e.g. 12) may function in a different manner than that illustrated in FIGS. 16 and 17.

Referring to FIGS. 16, 17, and 14, one method for using the circuitry illustrated in FIG. 14 will be described. At t0, start sampling the inputs (VIN 92 and VIN 93). At t1, finish sampling and start the partial successive approximation using minus DAC 282 and comparator 281. At t2, complete the partial successive approximation using minus DAC 282 and begin comparing the resulting voltage on the non-inverting and inverting inputs of comparator 260 to determine which is greater. At t3, if the inverting input of comparator 260 is greater than the non-inverting input of comparator 260, leave the voltage coupled to the first electrode of capacitor 208 at VREFH 88 (FIG. 16); however, if the inverting input of comparator 260 is not greater than the non-inverting input of comparator 260, switch the voltage coupled to the first electrode of capacitor 208 from VREFH 88 to VREFL 90 (FIG. 17). Then, begin the full successive approximation using plus DAC 280 and comparator 260 (see step 307 in FIG. 15). At t4, complete the successive approximation using plus DAC 280 and comparator 260. Note that after t2, minus result 285 has been determined, and after t4, plus result 284 has been determined. The method illustrated in FIG. 15 proceeds at step 308 after t4. Note that the method illustrated in FIG. 15 has been described herein above.

It should be noted for some embodiments, that the number of approximations required on the minus side during the partial successive approximation (see step 304 in FIG. 15) is a function of the common mode rejection ratio (CMRR) of comparator 261 and the resolution of the ADC. The higher the CMRR of comparator 261, the fewer approximations required. For example, a comparator with a CMRR of 66 dB in a 12-bit ADC only requires 2 approximations on the minus side (½ of 12-bit LSB=78 dB), so minus approximation needs to reduce the |Vcm−V−| voltage by 12 dB. As another example, a comparator with a CMRR of 72 dB in a 16-bit ADC only requires 5 approximations on the minus side (½ of 16-bit LSB=102 dB), so minus approximation needs to reduce the |Vcm−V−| voltage by 30 dB. Thus, only 5 approximations were required ($2^5$=30 dB).

A significant part of the cost of an ADC is the testing required. Traditionally ADC's are tested through the application of precise external voltages representing each of the possible conversion result values. To account for noise and to properly calculate error and thereby infer proper fabrication, the voltage is swept over several steps in the range of each possible value. This test method is time consuming and requires expensive test equipment. As the precision of ADCs increases, the test time and equipment expense also increases. In order to make higher accuracy ADCs more cost effective and also viable in the microcontroller market, it is desirable to reduce the test time and eliminate the need for special test equipment during ADC testing.

Figure 18:
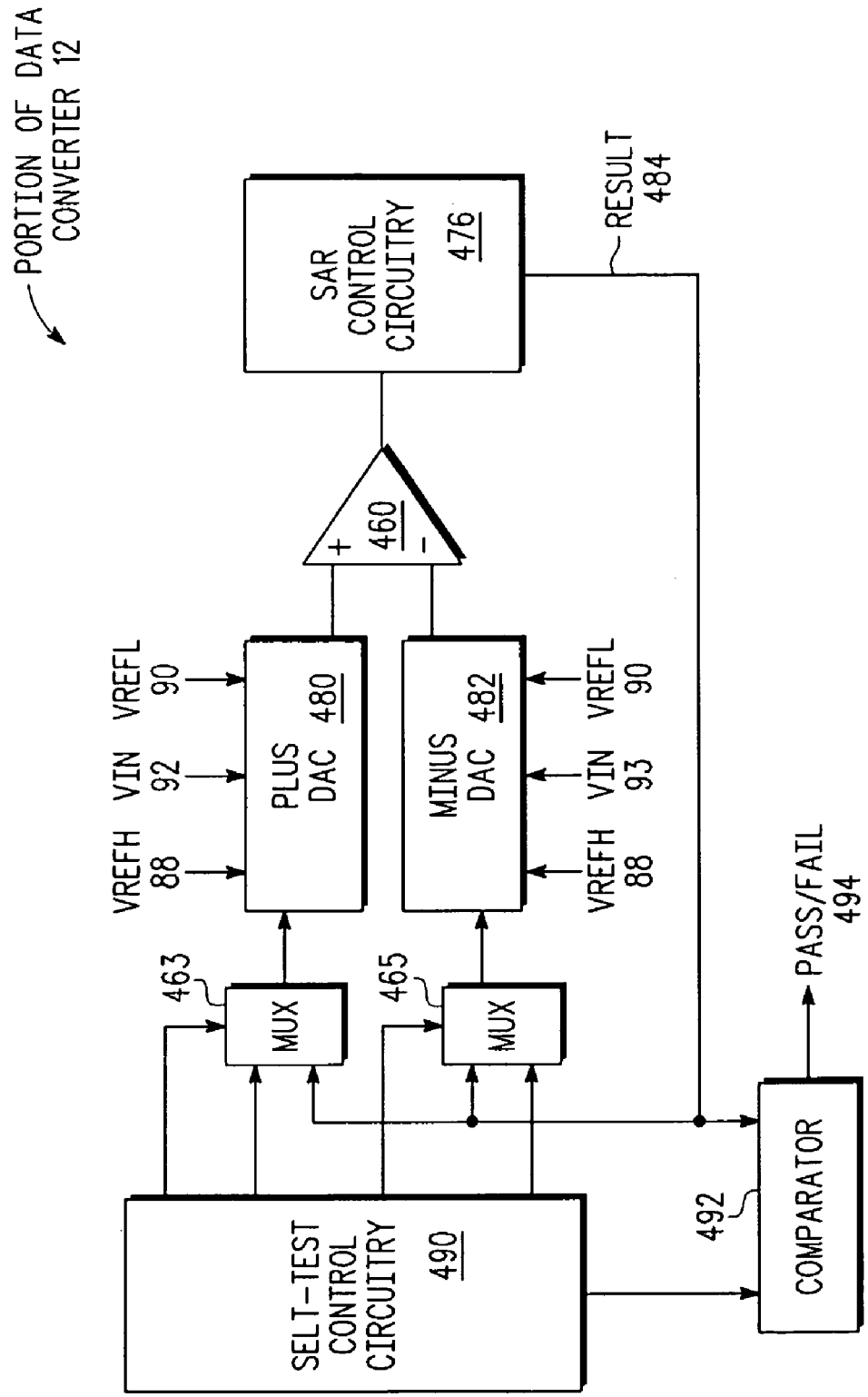
FIG. 18 illustrates, in partial block diagram form and partial schematic diagram form, a portion of a data converter in accordance with one embodiment.

FIG. 18 illustrates one embodiment of a portion of a data converter 12 of FIG. 1. In one embodiment, data converter 12 comprises a successive-approximation analog-to-digital converter (SAR ADC). In alternate embodiments, data converter 12 may be any type of charge redistribution array used for data conversion. In the illustrated embodiment, data converter 12 comprises a plus DAC 480, a minus DAC 482, a comparator 460, SAR control circuitry 476, comparator 492, self-test control circuitry 490, multiplexer (MUX) 463, and MUX 465. SAR control circuitry 476 receives the output of comparator 460 and provides a result signal 484 to comparator circuitry 492, to MUX 463, and to MUX 465. Self-test control circuitry 490 provides signals to MUX 463, to MUX 465, and to comparator 492. MUX 463 provides an input to plus DAC 480, and MUX 465 provides an input to minus DAC 482. In one embodiment, SAR control circuitry 476 comprises an SAR register such as, for example, SAR register 96 as in FIG. 3.

In the embodiment illustrated in FIG. 18, plus DAC 480 receives VREFH 88, VREFL 90, and VIN 92 as inputs. Minus DAC 482 receives VREFH 88, VREFL 90, and VIN 93 as inputs. In one embodiment, plus DAC 480 and minus DAC 482 each comprise an array of binary weighted elements, such as, for example, capacitors or resistors. In one embodiment, a portion of plus DAC 480 and a portion of minus DAC 482 may be implemented using circuitry such as that illustrated in FIG. 10, or variations thereof. In one embodiment, SAR control circuitry 476 comprises an SAR register, such as, for example, SAR register 96 in FIG. 3. In alternate embodiments, self-test circuitry 490, comparator 494, and pass/fail indicator 494 may be used with the circuitry configurations illustrated in FIG. 3 and FIG. 14. In addition, any appropriate configuration of data converter can take advantage of the self-test method and apparatus described herein.

In one embodiment, during normal operation, the SAR control circuitry 476 controls the DAC capacitors (see capacitors 208-221 in FIG. 10) to successively approximate an input voltage, where the output of comparator 460 is used by SAR control circuitry 476 to determine how to switch the capacitors in DACs 480 and 482. At each step of the approximation, the comparator output is stored in the SAR register in circuitry 476 and the resulting digital word is the digital representation of the analog input voltage. Once the comparison has completed, the digital value stored in the SAR register (e.g. SAR register 96 in FIG. 3) may be output as the digital result 484. Note that during a conversion, result 484 acts as an intermediate result that provides feedback information to comparator 492 and to DACs 480 and 482 via MUXes 463 and 465, respectively.

In one embodiment, during testing, comparator 492 receives a result value 484 from SAR control circuitry 476 and receives an expected value from self-test control circuitry 490. Comparator 492 then compares the actual conversion result value 484 to the expected conversion value and asserts or negates the pass/fail signal 494 based on whether the two digital values match. In another embodiment, comparator 492 compares the actual conversion result value 484 to an expected range of values and asserts or negates the pass/fail signal 494 based on whether the result is within that range. For some embodiments, if the pass/fail signal 494 indicates a "fail", comparator 492 is capable of providing information regarding how much the actual result 484 varied from the expected result (e.g. what is the most significant bit that did not match). Alternate embodiments may provide only a pass/fail signal 494, or may provide additional information about how the actual result value 484 differed from the expected value. Note that self-test control circuitry 490 controls which input of MUXes 463 and 465 are passed on to DAC 480 and 482, respectively. Thus self-test control circuitry 490 controls whether it provides the inputs to DACs 480 and 482, or whether DACs 480 and 482 receive feedback inputs from SAR control circuitry 476.

In one embodiment, a complete, very short time duration production self-test of a SAR ADC is provided with no increase in analog complexity or size. In one embodiment, a method of complete self-test of a SAR ADC is used wherein selected circuit elements (e.g. in DACs 480, 482) are used to generate test voltages, and those test voltages are then compared to expected voltages using different circuit elements (e.g. in DACs 480, 482). As a result of this method, it is possible to ensure not only an absence of defects due to short circuits and defects due to open circuits, but also to ensure the correct size (e.g. capacitance value) for all elements in DACs 480 and 482. In one embodiment, the opposing side (e.g. minus DAC 482) is charged to a predetermined offset voltage by charging a portion of the capacitors 210-219 (see FIG. 10) to VREFH 88 and the remainder of capacitors 210-219 to VREFL 90. The resulting offset voltage is proportional to the ratio of "the capacitance of the capacitors charged to VREFH 88" over "the total capacitance". By using this relationship, it is possible to determine whether or not the capacitance value for each capacitor under test (CUT) is within the desired range.

Figure 19:
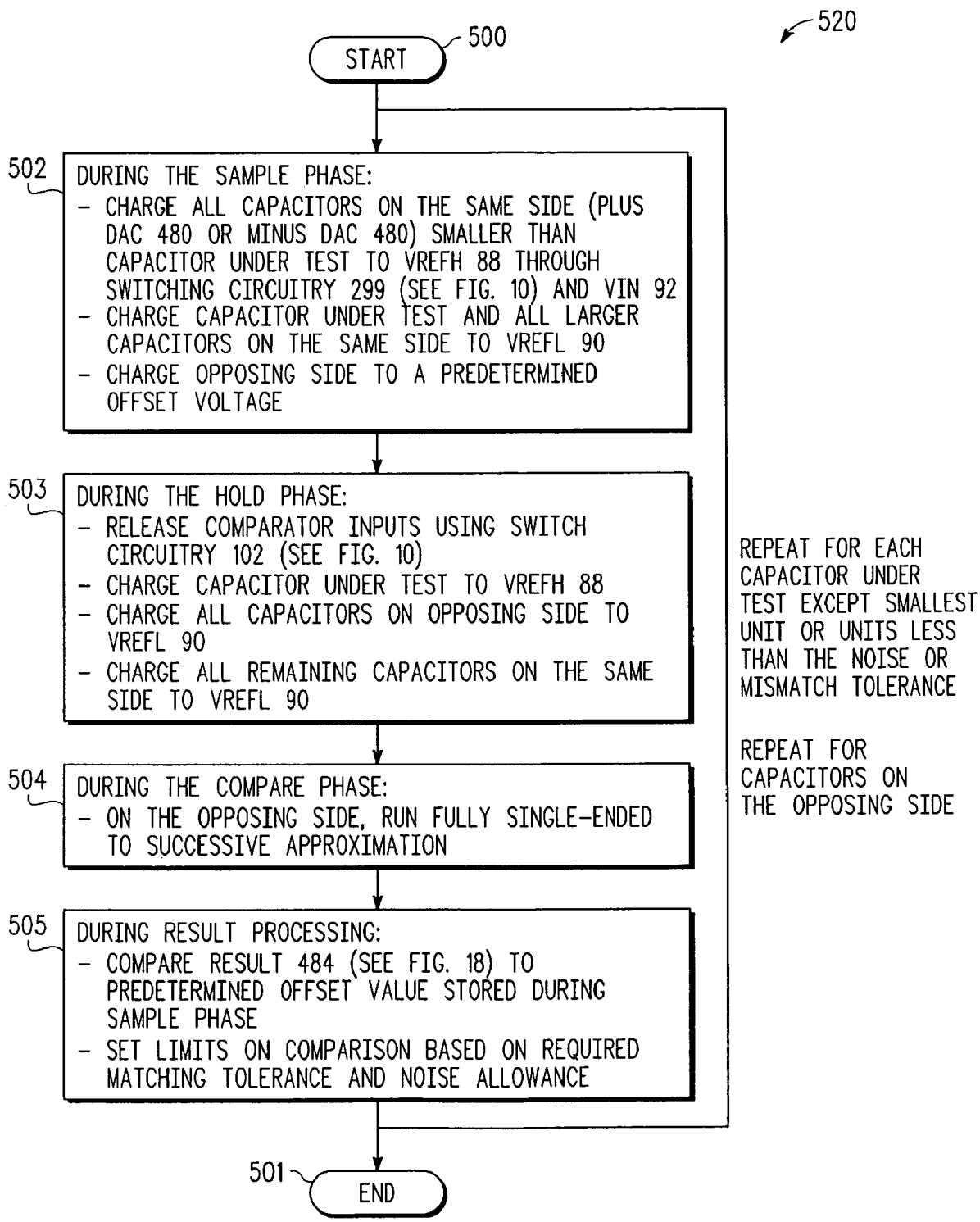
FIG. 19 illustrates, in flow diagram form, a self-test method for a differential capacitive DAC in accordance with one embodiment.
Figure 20:
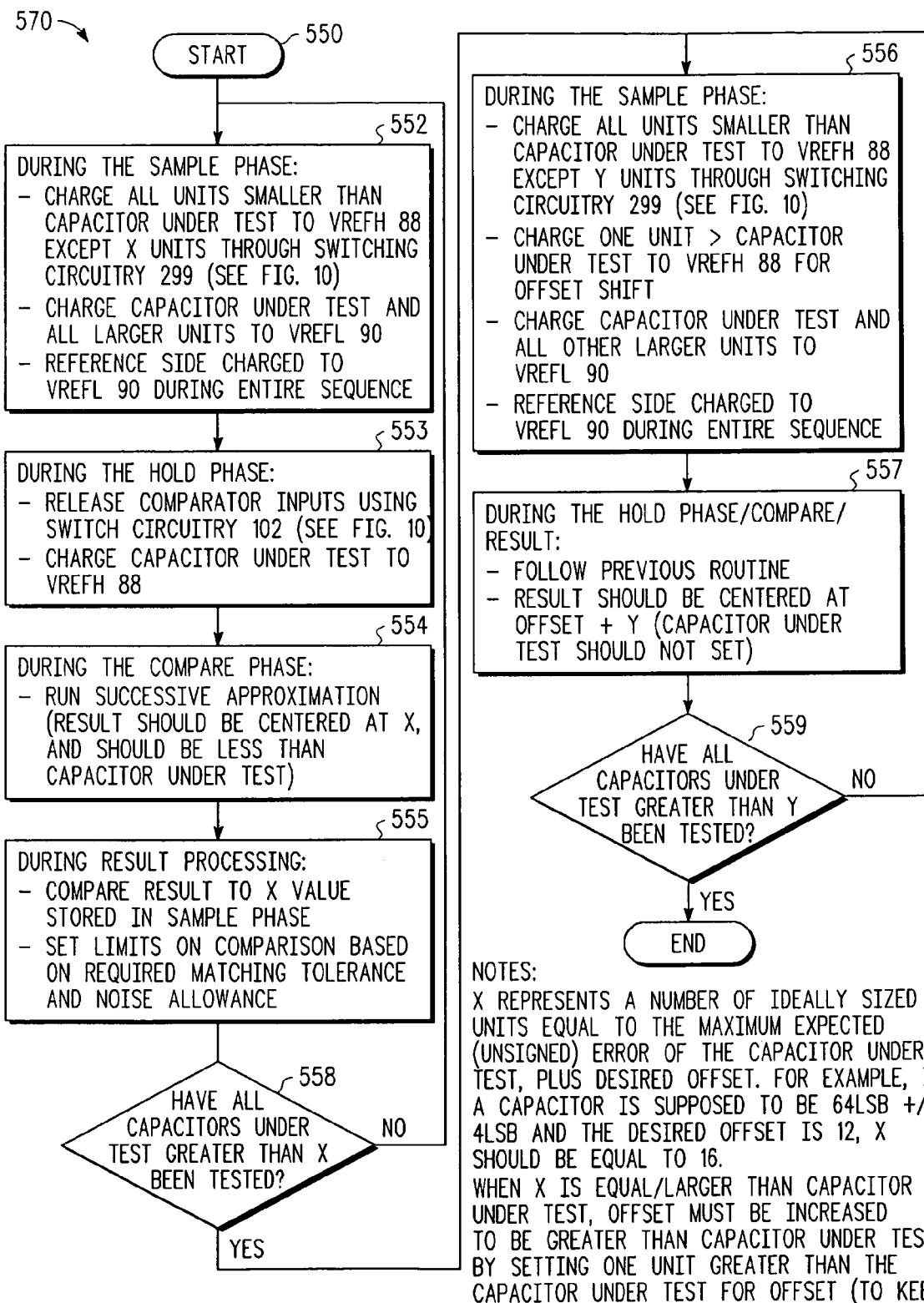
FIG. 20 illustrates, in flow diagram form, a self-test method for a single-ended capacitive DAC in accordance with one embodiment.

In one embodiment, self-test control circuitry 490 controls the sample and hold phases of the ADC during self-test. In one embodiment, the self-test sequence comprises sampling the high reference voltage (VREFH 88) on all elements smaller than the capacitor under test (CUT) and sampling the low reference voltage (VREFL 90) on all remaining capacitors in that DAC. During the hold and compare phases, the CUT is forced to VREFH 88 and the remaining capacitors in that DAC are forced to VREFL 90. The resulting error voltage is measured by successive approximation using only lower capacitors on the same side (single-ended) or of the opposing side (differential) of the ADC. Note that this method may be used, with some modifications, for any capacitive DAC. This method may also be used, with other modifications, for DACs which use resistive elements. The method is applicable to any appropriate and desired data converter. The method 520 illustrated in FIG. 19 is described in the context of a differential DAC (e.g. see FIG. 18). The method 570 illustrated in FIG. 20 is described in the context of a single-ended DAC. Note that for one embodiment, independent control of the sample, hold, and compare conditions of individual DAC elements (e.g. capacitors 208-221 in FIG. 10) are used. In one embodiment, the self-test control circuitry 490 (FIG. 18) comprises circuitry (e.g. a state machine, random logic, etc.) to control switch circuitry 102 and control circuitry 100 (see FIG. 4).

Note that the methods described in FIGS. 19 and 20 are able to detect errors due to using the CUT during approximation, allowable offset errors in the comparator, allowable zero scale errors (conversions or comparisons centered at VREFL 90), allowable mismatch errors of greater than one LSB, and the noise floor or randomization of the result 484. Note that for one embodiment, no additional analog circuitry is required, and only minimal digital circuitry is added. The total test time required to test data converter 12 of FIG. 18 using the methods described herein is much less because hundreds of thousands of independent ADC conversions (e.g. for a 16-bit ADC) are no longer required in order to test the circuitry in data converter 12. For one embodiment, sampling, holding, and approximating are performed on successively different elements (e.g. capacitors) in DACs 480 and 482, successive approximation is used to measure parametric error, and an intentional offset may be used. Thus, for some embodiments, only one test or a few tests may be required to test each element in DACs 480 and 482; and as a result, the hundreds of thousands of previously required independent ADC conversions may no longer be needed for testing purposes. This may result in a huge cost savings in test time and test equipment complexity.

Figure 21:
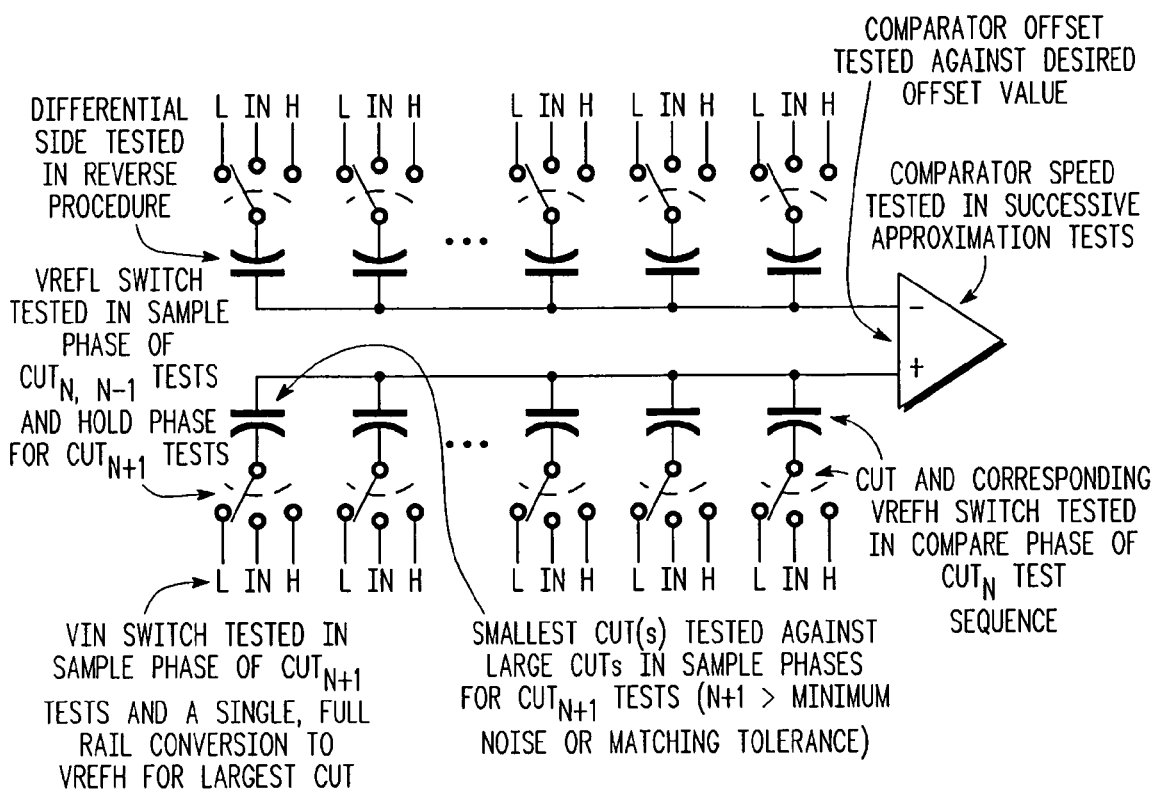
FIG. 21 illustrates, in schematic diagram form, test coverage of a self-test method in accordance with one embodiment.

FIG. 21 illustrates, for one embodiment, how the test methods described herein may be used to test all of the connections to each capacitor (e.g. 208-221 of FIG. 4) in a DAC (e.g. 480, 482 of FIG. 18) for both shorts and opens. Note that "L" represents the capacitor connections to VREFL 90, "H" represents the capacitor connections to VREFH 88, and "IN" represents the capacitor connections to VIN 92, 93. Note that the switches illustrated in FIG. 21 (and also as circuitry 102 in FIG. 4) may be implemented as digital circuitry (e.g. using one or more transistors).

In some applications using a data converter, it is desirable to be able to perform a higher speed, lower resolution conversion. For example, some applications do not require the full resolution capability of an ADC. Thus a data converter capability or an operating mode that decreases sampling time and increases bandwidth for performing lower resolution conversions may be desirable. In one embodiment, the digital conversion result may be scaled as a function of the ratio of total capacitance that was sampled in the DAC of an SAR ADC (see e.g. circuitry 480, 482, 460, and 476 of FIG. 18; data converter 12 of FIG. 2).

In one embodiment, the input voltage is sampled on only a fraction of the resistive elements and/or capacitive elements in a DAC (e.g. DAC 480 of FIG. 18). As a result of using only a portion of the resistive elements and/or capacitive elements, the sample time may be significantly reduced. Also, performing successive-approximation only to an acceptably lower accuracy level may reduce the number of clock cycles required as compared to a higher-resolution mode. In addition, digitally adjusting the conversion result based on what fraction of DAC capacitors were sampled, including adding a ½ LSB shift, may be used for some embodiments. For a 16-bit data converter illustrated in FIG. 2, operating in a 12-bit mode saves approximately 6 cycles of conversion time compared to a 16-bit mode. This time savings may be due to the faster sampling (lower capacitance), and due to not needing to perform the full successive-approximation. In one embodiment, the time savings also allows for a ½ LSB shift without analog circuit adjustments. In one embodiment, these time savings, combined with the fact that the comparator (e.g. 460 in FIG. 18) only has to resolve 12-bits, allows the lower resolution mode to have twice the bandwidth of the 16-bit mode. In applications with high external source resistance that require longer sampling times, the bandwidth improvements of the lower resolution mode may be even more significant.

Figure 22:
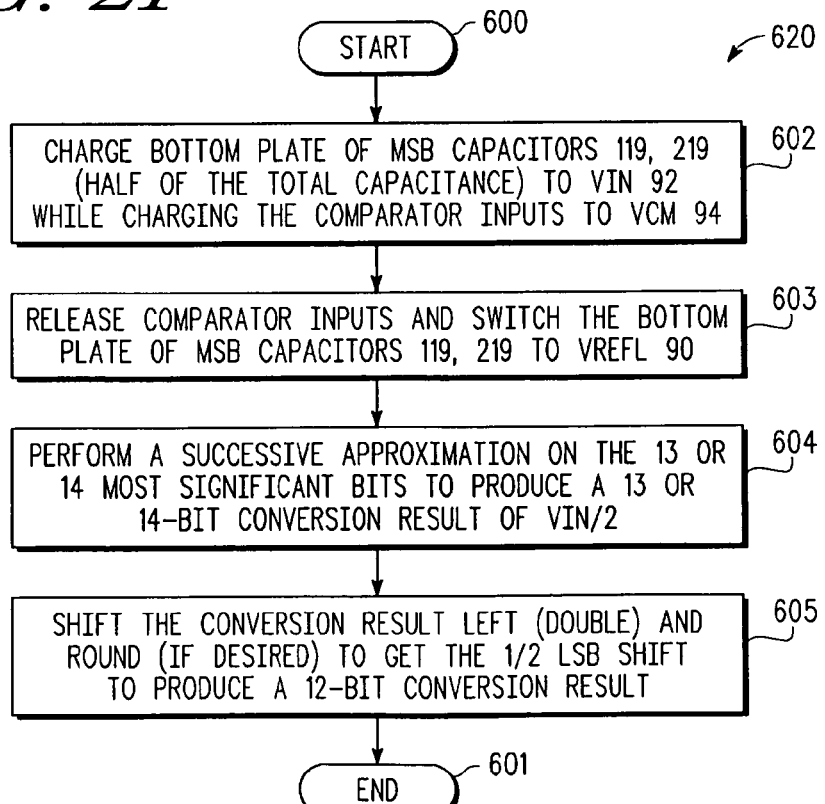
FIG. 22 illustrates, in flow diagram form, a method for performing a 12-bit conversion in a 16-bit ADC in accordance with one embodiment.

FIG. 22 illustrates a method 620 for performing a 12-bit conversion in a 16-bit ADC in accordance with one embodiment. Various embodiments of method 620 may be used in any appropriate and desired data converter. One possible embodiment of a data converter that may utilize method 620 is the embodiment of data converter 12 illustrated in FIG. 3. Also, see FIG. 4 for one embodiment of a portion of DAC 80 of FIG. 3, and see FIG. 10 for an alternate embodiment of a portion of DAC 80 of FIG. 3.

In method 620 of FIG. 22, the process starts at oval 600 and proceeds to step 602 where the bottom plate (e.g. first electrode) of the MSB capacitor (e.g. 119 or 219) are charged to the voltage VIN 92, while the comparator 60 inputs are charged to voltage VCM 94. Note that in the illustrated embodiment, step 602 effectively charges approximately half of the total capacitance to VIN 92. Alternate embodiments could instead charge a different fraction of the total capacitance, such as, for example, any fraction of the total capacitance that is a division by a power of two (e.g. ½, ¼, ⅛, 1/16, etc.). From step 602, the process proceeds to step 603 where the inputs to comparator 60 are released and the bottom plate of the MSB capacitor (e.g. 119 or 219) are switched to VREFL 90. From step 603, the process proceeds to step 604 where a successive approximation is performed on the 13 or 14 most significant bits to produce a 13 or 14 bit conversion result for VIN/2 (one half of the input voltage). From step 604, the process proceeds to step 605 where the conversion result is shifted left (i.e. doubled or multiplied by 2) and rounded, if desired, to get the ½ LSB shift to produce a 12-bit final conversion result for VIN. After step 605, the process then ends at oval 601. In one embodiment, the rounding of the scaled conversion result may be performed in any known prior art manner to produce the rounded scaled conversion result. In addition, although the rounding may be performed using any number of the least significant bits, most applications will use one or two of the least significant bits to produce the rounded scaled conversion.

Note that the embodiment of method 620 described in FIG. 22 effectively performs a conversion for only half of the input voltage (VIN/2) by using only half of the total capacitance. More than 12 bits of the raw result may be retained. The raw conversion result is then shifted left one bit place, which effectively multiplies the raw conversion result by two. Alternate embodiments may or may not use any desired and appropriate method of rounding. An alternate embodiment may perform a conversion for only ¼ of the input voltage (VIN/4) by using only ¼ of the total capacitance (e.g. in DAC 80). The raw conversion result is then shifted left two bit places, which effectively multiplies the raw conversion result by four. More than 12 bits of the raw result may be retained so that there are bits to shift in as the LSBs during the effective multiplication. Alternate embodiments may use any fraction of the total capacitance that is equal to dividing by a power of two so that shifts of the raw result may be used to determine the final conversion result. Thus in one embodiment, the raw conversion result is scaled to produce the final conversion result based on the ratio of the capacitance actually used for the conversion over the total capacitance available for the conversion.

In one embodiment, control registers 31 in data converter 12 of FIG. 2 may comprise one or more user programmable bits that may be used by SAR control circuitry to determine when to use the higher speed, lower resolution conversion mode (e.g. when to perform a 12-bit conversion using a 16-bit ADC). Alternately, one or more integrated circuit pins or terminals (similar to those used to couple bus 24 to the external world) may be coupled to data converter 12 and may be used to provide at least one conversion mode signal from the external world to data converter 12. At least one conversion mode signal may select a first mode (e.g. a 16-bit conversion for a 16-bit ADC), and alternately may select a second higher speed and/or a lower resolution conversion mode (e.g. a 12-bit conversion for a 16-bit ADC). Alternate embodiments may have any number of desired and appropriate conversion modes, and may select the conversion mode to be used in any desired and appropriate manner. In addition, although a sample embodiment has been described in the context of a 12-bit conversion on a 16-bit ADC, any desired and appropriate resolution conversion on any desired and appropriate resolution ADC may be used.

By now it should be appreciated that there has been provided a data converter with a number of beneficial features.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIGS. 1 and 2 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory 18 may be located on a same integrated circuit as processor 16 or on a separate integrated circuit or located within another peripheral or slave discretely separate from other elements of system 10. Data converter 12 may also be located on a separate integrated circuit or device. Also for example, system 10 or portions thereof may be soft or code representations of physical circuitry or of logical representations convertible into physical circuitry. As such, system 10 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, any one or more of the features described herein may be used in any desired and appropriate combination with any other feature(s). Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Additional Text

1. A data converter for example (12), comprising:
    a first DAC array for example (480 of FIG. 18);
    a first comparator for example (460) coupled to receive an input from the first DAC array, the first comparator providing an output;
    successive approximation circuitry for example (476) coupled to the output of the first comparator, the successive approximation circuitry providing an actual test result value for example (484);
    self-test circuitry for example (490) which generates and provides an expected test result value;
    a second comparator for example (492), coupled to the successive approximation circuitry to receive the actual test result value, and coupled to the self-test circuitry to receive the expected test result value; and
    one or more conductors for example (pass/fail 494) coupled to the second comparator which provide one or more signals for indicating whether the actual test result value is within a predetermined range compared to the expected test result value, wherein for a first situation the actual test result value is different than the expected test result value yet the one or more signals indicate that the actual test result value is still within the predetermined range, and wherein for a second situation the actual test result value is different than the expected test result value and the one or more signals indicate that the actual test result is not within the predetermined range.

2. A data converter as in statement 1 or any other appropriate other statement herein, wherein the one or more signals indicate whether the actual test result value exactly matches the expected test result value.

3. A data converter as in statement 1 or any other appropriate other statement herein, further comprising:
    a first multiplexer for example (463) having a first input coupled to receive the actual test result value, having a second input coupled to receive a first provided test value from the self-test circuitry, having a control input coupled to the self-test circuitry, and having an output coupled to the first DAC array.

4. A data converter as in statement 1 or any other appropriate other statement herein, further comprising:
    a second DAC array for example (482) coupled to the first comparator.

5. A data converter as in statement 1 or any other appropriate other statement herein, further comprising:
    a second multiplexer for example (465) having a first input coupled to receive the actual test result value, having a second input coupled to receive a second provided test value from the self-test circuitry, having a control input coupled to the self-test circuitry, and having an output coupled to the second DAC array.

6. A data converter as in statement 1 or any other appropriate other statement herein, wherein the first DAC array comprises:
    a plurality of binary weighted elements for example (110-119 of FIG. 4; 210-219 of FIG. 10); and
    control circuitry for example (100 of FIG. 4; 200 of FIG. 10) for controlling which one of a plurality of voltages for example (VREFH 88, VREFL 90, VIN 92) is coupled to each one of the plurality of binary weighted elements.

7. A data converter as in statement 1 or any other appropriate other statement herein, wherein the first DAC array for example (480 or 482) is charged to a predetermined offset voltage in order to generate the expected test result value, wherein the predetermined offset voltage is non-zero.

8. A data converter as in statement 6 or any other appropriate other statement herein, wherein the control circuitry provides independent control of each one of the plurality of binary weighted elements during each of a sample phase, a hold phase, and a compare phase.

9. A data converter as in statement 6 or any other appropriate other statement herein, wherein both the successive approximation circuitry and the self-test circuitry are coupled for example (through a MUX 463 of FIG. 18) to control the control circuitry in the first DAC array.

10. A data converter as in statement 1 or any other appropriate other statement herein, further comprising:
   result adjustment circuitry for example (70 of FIG. 3; 270 of FIG. 14) coupled to receive the actual test result value, the result adjustment circuitry producing a calibrated test result value.

11. A data converter as in statement 1 or any other appropriate other statement herein, wherein successive approximation is used to measure parametric error.

12. A method for example (520 in FIG. 19; 570 in FIG. 20) for testing a data converter for example (12), comprising:
   during a sample phase for example (502 in FIG. 19 for differential; 552 in FIG. 20 for single-ended),
      when the data converter is differential, coupling a first reference voltage for example (VREFH 88) to all circuit elements smaller than a first circuit element under test [CUT] and coupling a second reference voltage for example (VREFL 90) to a remaining portion of circuit elements,
      when the data converter is differential and a positive side of the data converter is being tested, coupling a first predetermined number of circuit elements in a negative side of the data converter to the first reference voltage for example (VREFH 88),
      when the data converter is differential and the negative side of the data converter is being tested, coupling a second predetermined number of circuit elements in the positive side of the data converter to the first reference voltage for example (VREFH 88),
      when the data converter is single-ended and the first CUT is larger than a predetermined size, coupling the first reference voltage for example (VREFH 88) to a first portion of the circuit elements smaller than the first CUT, coupling the second reference voltage for example (VREFL 90) to a second portion of the circuit elements smaller than the first CUT, and coupling the second reference voltage for example (VREFL 90) to the first CUT and to all circuit elements larger than the first CUT,
      when the data converter is single-ended and the first CUT is smaller than the predetermined size, coupling the first reference voltage for example (VREFH 88) to the first portion of the circuit elements smaller than the first CUT, coupling the second reference voltage for example (VREFL 90) to the second portion of the circuit elements smaller than the first CUT, coupling the first reference voltage for example (VREFH 88) to a third portion of the circuit elements larger than the first CUT, and coupling the second reference voltage for example (VREFL 90) to the first CUT and to a fourth portion of the circuit elements larger than the first CUT;
   during a hold phase for example (503 in FIG. 19; 553 in FIG. 20), forcing the first circuit element under test to the first voltage reference for example (VREFH 88) and forcing the remaining portion of circuit elements to the second reference voltage for example (VREFL 90); and
   during a compare phase for example (504 in FIG. 19; 554 in FIG. 20), determining a resulting error voltage by performing successive approximation.

13. A method as in statement 12 or any other appropriate other statement herein, wherein the first reference voltage is higher than the second reference voltage.

14. A method as in statement 12 or any other appropriate other statement herein, further comprising:
   comparing the resulting error voltage to an expected error value to produce a comparison result for example (505 in FIG. 19; 555 in FIG. 20), wherein the expected error value is not zero; and
   using the comparison result to determine whether the data converter passed the test for example (494 in FIG. 18).

15. A method as in statement 12 or any other appropriate other statement herein, wherein the data converter is a differential data converter for example (FIG. 19) having a first differential side and a second differential side for example (FIG. 18), wherein the first circuit element under test is located on the first differential side for example (502 in FIG. 19), and wherein the successive approximation for the first circuit element under test is performed by the second differential side for example (504 in FIG. 19).

16. A method as in statement 15 or any other appropriate other statement herein, wherein the successive approximation performed on the second differential side is performed without differential signals as if the second differential side was single-ended.

17. A method as in statement 15 or any other appropriate other statement herein, further comprising:
   selecting a second circuit element under test, wherein the second circuit element under test is located on the second differential side; and
   repeating each step of statement 12 using the second circuit element under test instead of the first element under test, wherein the successive approximation for the second circuit element under test is performed by the first differential side.

18. A method as in statement 17 or any other appropriate other statement herein, wherein the first circuit element under test comprises a capacitive element.

19. A method for example (520 in FIG. 19; 570 in FIG. 20) for testing a data converter for example (12), comprising:
   providing a plurality of capacitive elements for example (110-119 of FIG. 4; 210-219 of FIG. 10) in the data converter;
   providing circuitry for example (100 in FIG. 4; 200 in FIG. 10) in the data converter for independently coupling each of the plurality of capacitive elements to one of a plurality of voltages;
   selecting a first one of the plurality of capacitive elements as a capacitive element under test;
   during a first test period for example (sample phase 502 in FIG. 19; 552, 556 in FIG. 20), coupling a first one of the plurality of voltages for example (VREFH 88) to a first portion of the plurality of capacitive elements that are smaller than the capacitive element under test, and coupling a second one of the plurality of voltages for example (VREFL 90) to a second portion of the plurality of capacitive elements that are a same size or larger than the capacitive element under test, and coupling a selected one of the plurality of voltages to a third portion of the plurality of capacitive elements;
   during a second test period for example (hold phase 503 in FIG. 19; 553, 557 in FIG. 20), coupling the capacitive element under test to the first one of the plurality of voltages for example (VREFH 88), coupling the second portion of the plurality of capacitive elements to the second one of the plurality of voltages for example (VREFL 90), and coupling the third portion of the plurality of capacitive elements to a different selected one of the plurality of voltages to generate an offset voltage; and during a third test period for example (compare phase 504 in FIG. 19; 554 in FIG. 20), determining a resulting error voltage by performing successive approximation using the data converter.

20. A method as in statement 19 or any other appropriate other statement herein, wherein the plurality of voltages comprise a high reference voltage for example (VREFH 88), a low reference voltage for example (VREFL 90), and an input voltage for example (VIN 92), and wherein the capacitive element under test is tested without coupling the input voltage to any of the plurality of capacitive elements during the first, second, and third time periods.

21. A method for example (520 in FIG. 19; 570 in FIG. 20) for testing a data converter for example (12), comprising:
 providing a plurality of binary weighted elements for example (110-119 of FIG. 4; 210-219 of FIG. 10) in the data converter;
 providing circuitry for example (100 in FIG. 4; 200 in FIG. 10) in the data converter for independently coupling each of the plurality of binary weighted elements to any one of a plurality of voltages during testing of the data converter,
 wherein the plurality of voltages comprise a high reference voltage for example (VREFH 88), a low reference voltage for example (VREFL 90), and an input voltage for example (VIN 92); and
 selecting a first one of the plurality of binary weighted elements as a binary weighted element under test,
 wherein the binary weighted element under test is tested without coupling the input voltage to any of the plurality of capacitive elements during testing of the data converter.

22. A method for example (620 of FIG. 22), comprising:
 providing one or more conductors for example (conductors MODE of FIG. 2) for transferring control information, the control information selecting whether a data conversion in a data converter for example (12) is to be a J-bit data conversion or an A-bit data conversion, wherein J and A are integers, and wherein the data converter has a charge redistribution array for example (62 of FIG. 3; 480, 482 of FIG. 18) having a total capacitance C;
 when the J-bit data conversion is selected, performing the J-bit data conversion using the data converter; and
 when the A-bit data conversion is selected, performing the A-bit data conversion using the data converter,
 wherein the data converter is used to perform both the J-bit data conversion and the A-bit data conversion, and
 wherein the step of performing the A-bit data conversion using the data converter comprises:
  receiving an input voltage that is to be converted for example (602);
  using the input voltage to charge a first portion of the total capacitance C of the charge redistribution array, wherein the first portion of the total capacitance C of the charge redistribution array is less than all of the total capacitance C for example (602, 603);
  performing a successive approximation on L most significant bits to produce an unscaled conversion result, wherein L is an integer less than J and greater than A for example (604); and
  shifting the unscaled conversion result to produce a scaled conversion result for example (605).

23. A method as in statement 22 or any other appropriate other statement herein, wherein the step of performing the A-bit data conversion using the data converter further comprises:
 rounding the scaled conversion result to produce a scaled and rounded conversion result for example (605).

24. A method as in statement 23 or any other appropriate other statement herein, wherein the step of rounding comprises:
 using a plurality of least significant bits of the scaled conversion result to determine rounding.

25. A method as in statement 22 or any other appropriate other statement herein, wherein the first portion of the total capacitance C of the charge redistribution array is approximately half of the total capacitance C of the charge redistribution array.

26. A method as in statement 22 or any other appropriate other statement herein, wherein J is 16, A is 12, and L is 13.

27. A method as in statement 22 or any other appropriate other statement herein, further comprising:
 providing storage circuitry for example (control registers 31 of FIG. 2) for storing the control information.

28. A method as in statement 22 or any other appropriate other statement herein, wherein said step of shifting comprises:
 left shifting the unscaled conversion result to produce the scaled conversion result.

29. A method as in statement 22 or any other appropriate other statement herein, wherein the A-bit data conversion has a lower resolution and a higher bandwidth than the J-bit data conversion.

30. A method as in statement 22 or any other appropriate other statement herein, wherein the charge redistribution array has a total resistance R instead of a total capacitance C.

31. A method as in statement 22 or any other appropriate other statement herein, wherein the charge redistribution array comprises both resistive elements and capacitive elements.

32. A method as in statement 22 or any other appropriate other statement herein, wherein the data converter performs the J-bit data conversion in less time than the data converter performs the A-bit data conversion.

33. A method as in statement 22 or any other appropriate other statement herein, wherein the data converter comprises an analog to digital converter.

34. A data converter, comprising:
 storage circuitry for example (control register 31 of FIG. 2) for storing control information, the control information selecting whether a data conversion in the data converter for example (12) is to be a J-bit data conversion or an A-bit data conversion, wherein J and A are integers;
 a charge redistribution array for example (62 of FIG. 3; 280, 282 of FIG. 14) comprising a plurality of binary weighted elements for example (resistive elements and/or capacitive elements);
 one or more input terminals for example (92 of FIG. 3) for receiving an input to be converted; and
 control circuitry for example (100 of FIG. 4; 200 of FIG. 10) which receives the control information for example (control 63 of FIG. 4; control 65 of FIG. 10) and in response determines which of the binary weighted elements to couple to the one or more input terminals,
 wherein when the data conversion in the data converter for example (12) is the J-bit data conversion, the control circuitry couples all of the binary weighted elements to the one or more input terminals, and
 wherein when the data conversion in the data converter for example (12) is the A-bit data conversion, the control circuitry couples only a portion of the binary weighted elements to the one or more input terminals, wherein the portion of the binary weighted elements is less than all of the binary weighted elements.

35. A data converter as in statement 34 or any other appropriate other statement herein, wherein the storage circuitry comprises a user programmable register.

36. A data converter as in statement 34 or any other appropriate other statement herein, further comprising:
a comparator for example (60 of FIG. 3; 260, 261 of FIG. 14) having an input coupled to the charge redistribution array and having an output; and
successive approximation circuitry for example (76 of FIG. 3; 276 of FIG. 14), coupled to the output of the comparator for providing a conversion result.

37. A data converter as in statement 34 or any other appropriate other statement herein, wherein the conversion result from the successive approximation circuitry is an uncalibrated conversion result for example (84 of FIG. 3), and wherein the data converter further comprises:
result adjustment circuitry for example (70 of FIG. 3; 270 of FIG. 14) which receives the uncalibrated conversion result and which performs a mathematical computation on the uncalibrated conversion result to produce a calibrated conversion result.

38. A data converter as in statement 34 or any other appropriate other statement herein, wherein the result adjustment circuitry comprises an accumulator for example (72 of FIG. 3).

39. A method for example (620 of FIG. 22), comprising:
providing mode select circuitry for example (control registers 31 of FIG. 2) to select one of a plurality of conversion modes in a data converter;
providing a first conversion mode for example (higher resolution/lower bandwidth/longer sampling time) of the plurality of conversion modes having a first resolution and having a first bandwidth; and
providing a second conversion mode for example (lower resolution/higher bandwidth/shorter sampling time) of the plurality of conversion modes having a second resolution and having a second bandwidth,
wherein the first resolution of the first conversion mode is higher than the second resolution of the second conversion mode, and
wherein the first bandwidth of the first conversion mode is lower than the second bandwidth of the second conversion mode.

40. A method as in statement 39 or any other appropriate other statement herein, wherein a sampling time of the second conversion mode is shorter than a sampling time of the first conversion mode.

41. A method as in statement 39 or any other appropriate other statement herein, further comprising:
receiving an input voltage for example (VIN 92 of FIG. 3 and FIG. 14; 620 of FIG. 22);
converting a fraction of the input voltage to a digital value, wherein the fraction of the input voltage is less than one and greater than zero for example (603, 604 of FIG. 22);
left shifting the digital value to produce a digital conversion result corresponding to the input voltage for example (605 of FIG. 22).

42. A method for example (320 in FIG. 15), comprising:
performing for example (304) a partial single-ended approximation of an analog-to-digital converter minus input for example (VIN 93) using a first DAC for example (282 in FIG. 14) and a first comparator for example (261) to produce a minus result for example (285);
performing for example (307) a full single-ended approximation of an analog-to-digital converter plus input for example (VIN 92) using a second DAC for example (280) and a second comparator for example (260) to produce a plus result for example (284); and
combining the minus result and the plus result to produce a conversion result for example (286).

43. A method as in statement 42 or any other appropriate other statement herein, further comprising:
providing a differential bias capacitor for example (208 in FIG. 14 and FIG. 10) having a first terminal coupled to a reference voltage for example (VREFH 88, VREFL 90 in FIG. 14) and having a second terminal coupled to a positive input of the second comparator for example (260).

44. A method as in statement 43 or any other appropriate other statement herein, wherein the differential bias capacitor has a capacitance approximately equal to a capacitance of a predetermined capacitor in the first DAC for example (282).

45. A method as in statement 43 or any other appropriate other statement herein, wherein the reference voltage is a high reference voltage for example (VREFH 88) during at least a portion of the step of performing the partial single-ended approximation of the analog-to-digital converter minus input for example (VIN 93).

46. A method as in statement 45 or any other appropriate other statement herein, further comprising:
selectively coupling the first terminal of the differential bias capacitor for example (208 in FIG. 14 and FIG. 10) to a low reference voltage for example (VREFL 90) depending upon an output of the second comparator for example (260).

47. A method as in statement 46 or any other appropriate other statement herein, wherein the step of selectively coupling comprises:
coupling the first terminal of the differential bias capacitor for example (208 in FIG. 14 and FIG. 10) to the low reference voltage for example (VREFL 90) when the output of the second comparator for example (260) is high.

48. A method as in statement 42 or any other appropriate other statement herein, wherein a negative input of the first comparator for example (261) is coupled to a common mode voltage for example (VCM 94).

49. A method as in statement 42 or any other appropriate other statement herein, wherein the step of performing the partial single-ended approximation of the analog-to-digital converter minus input for example (VIN 93) causes a negative input to the second comparator for example (260) to be within a predetermined range of a common mode voltage for example (VCM 94).

50. A method as in statement 42 or any other appropriate other statement herein, wherein the second comparator (260) has greater accuracy than the first comparator for example (261).

51. A data converter for example (12), comprising:
first circuitry for example (282, 261 in FIG. 14) which performs a partial single-ended approximation of an analog-to-digital converter minus input to produce a minus result for example (285);
second circuitry for example (280, 260) which performs a full single-ended approximation of an analog-to-digital converter plus input to produce a plus result for example (284); and result circuitry for example (270 and/or 274) which combines the minus result and the plus result to produce a conversion result for example (286).

52. A data converter as in statement 51 or any other appropriate other statement herein, wherein the first circuitry comprises:
a first DAC for example (282) having a first input for receiving the analog-to-digital converter minus input for example (VIN 93), having a second input for receiving a first reference voltage for example (VREFH 88 or VREFL 90), and having an output; and
a first comparator for example (261) having a first input (+) coupled to the output of the first DAC, having a second input (−) coupled to a common mode voltage for example (VCM 94), and having an output for serially providing the minus result for example (285, the output of 261 provides the bits of the minus result serially, the output of 276 provides the bits of the minus result 285 serially or in parallel, while the output of 270 may provide the bits of result 286 serially or in parallel).

53. A data converter as in statement 52 or any other appropriate other statement herein, wherein the second circuitry comprises:
a second DAC for example (280) having a first input for receiving the analog-to-digital converter plus input for example (VIN 92), having a second input for receiving a second reference voltage for example (VREFH 88 or VREFL 90), and having an output; and
a second comparator for example (260) having a first input (+) coupled to the output of the second DAC, having a second input (−) coupled to the output of the first DAC, and having an output for serially providing the plus result for example (284, the output of 260 provides the bits of the plus result serially, the output of 276 provides the bits of the plus result 284 serially or in parallel, while the output of 270 may provide the bits of result 286 serially or in parallel).

54. A data converter as in statement 53 or any other appropriate other statement herein, further comprising:
a differential bias capacitor for example (208) having a first terminal coupled to a third reference voltage for example (VREFH 88 or VREFL 90) and having a second terminal coupled to the first input (+) of the second comparator for example (260).

55. A data converter as in statement 54 or any other appropriate other statement herein, wherein the differential bias capacitor for example (208) has a capacitance approximately equal to a capacitance of a predetermined capacitor for example (see FIG. 10) in the first DAC for example (282).

56. A data converter as in statement 51 or any other appropriate other statement herein, wherein the result circuitry comprises:
computation circuitry for example (274) for determining a difference between a plus result for example (284) and a minus result for example (285) to produce a differential result for example (308 in FIG. 15).

57. A data converter as in statement 56 or any other appropriate other statement herein, wherein the computation circuitry for example (274) subtracts the minus result for example (285) from the plus result for example (284) to produce a differential result for example (308 in FIG. 15).

58. A data converter as in statement 57 or any other appropriate other statement herein, wherein the computation circuitry for example (274) subtracts a predetermined amount from the differential result to produce the conversion result for example (286 in FIG. 14; 310 in FIG. 15) when a first terminal of a bias capacitor for example (208) was switched from a first reference voltage for example (VREFH 88) to a second reference voltage for example (VREFL 90) during conversion for example (309, 310 in FIG. 15).

59. A method for example (320 in FIG. 15), comprising:
performing a partial successive approximation routine in an analog-to-digital converter for example (12 in FIG. 1) to produce a first result for example (minus result 285 in FIG. 14) for example (see 302, 303, 304 in FIG. 15), wherein the step of performing the partial successive approximation routine comprises:
providing a voltage at a negative input (−) of a comparator for example (260), wherein the voltage is substantially equal to a common mode voltage for example (VCM 94) of the comparator for example (see 302, 303 in FIG. 15) for example (substantially equal to the common mode voltage may mean that the voltage is within a predetermined range of the common mode voltage, and the predetermined range of the common mode voltage may be at most one half the range of VIN 92);
after said step of performing the partial successive approximation routine, selectively switching a differential bias capacitor for example (208) from a first reference voltage for example (VREFH 88) to a second reference voltage for example (VREFL 90) when a positive input (+) of the comparator for example (260) is higher than the negative input (−) of the comparator for example (see 306 in FIG. 15);
after said step of performing the partial successive approximation routine, performing a full successive approximation routine in the analog-to-digital converter to produce a second result for example (plus result 284) for example (see 307 in FIG. 15);
combining the minus result for example (285) and the plus result for example (284) to produce a differential result for example (see 308 in FIG. 15); and
subtracting a predetermined value from the differential result to produce a conversion result for example (286) if the differential bias capacitor for example (208) was switched from the first reference voltage for example (VREFH 88) to the second reference voltage for example (VREFL 90) during said step of selectively switching.

60. A method as in statement 59 or any other appropriate other statement herein, further comprising:
providing a first comparator for example (261) in the analog-to-digital converter, the first comparator having a first accuracy; and
providing a second comparator for example (260) in the analog-to-digital converter, the second comparator having a second accuracy,
wherein the second accuracy of the second comparator is at least twice as accurate as the first accuracy of the first comparator.

61. A method as in statement 60 or any other appropriate other statement herein, wherein the first comparator for example (261) is used to perform said step of performing the partial successive approximation routine for example (see 302, 303, 304 in FIG. 15), and wherein the second comparator for example (260) is used to perform said step of performing the full successive approximation routine for example (see 307 in FIG. 15).

62. A method for example (271 in FIG. 11), comprising:
providing a J-bit analog to digital converter for example (12) which receives an analog input signal and produces a corresponding uncalibrated digital result, the uncalibrated digital result having bit 0 as a least significant bit, having bit J−1 as a most significant bit, and having bit K between bit 0 and bit J−1, the analog to digital converter having a plurality of capacitive elements for example (210-219 of FIG. 10) wherein the plurality of capacitive elements are sufficient to perform a J-bit analog to digital conversion, and wherein J and K are integers;

providing an extra capacitive element for example (209 in FIG. 10) in addition to the plurality of capacitive elements;

providing an extra result bit for example (256 in FIG. 11; 96 in FIG. 3);

providing an analog input voltage at a first input of a comparator for example (252 in FIG. 11);

using a first portion of the plurality of capacitive elements for example (corresponding to bit K through bit J−1) and the extra capacitive element to produce a voltage step for example (VREFH-VREFL) at a second input of the comparator for example (60 of FIG. 3; 253, 254 in FIG. 11);

if a resulting output of the comparator is a first voltage for example (if low, take YES path from 255; 258, 259), asserting the extra result bit and negating bit K through the most significant bit of the uncalibrated digital result, and performing successive approximations to determine bits K−1 to 0 of the uncalibrated digital result; and if the resulting output of the comparator is a second voltage for example (if high, take NO path from 255; 256, 257, 259), negating the extra result bit and performing successive approximations to determine bits J−1 to 0 of the uncalibrated digital result.

63. A method as in statement 62 or any other appropriate other statement herein, further comprising:
calibrating the uncalibrated digital result to produce a calibrated result, wherein the step of calibrating does not reduce a predetermined range of the analog input signal.

64. A method as in statement 62 or any other appropriate other statement herein, wherein the step of providing an extra result bit comprises performing an extra approximation step that is not required when performing a J-bit analog to digital conversion having a reduced input range after calibration.

65. A method as in statement 62 or any other appropriate other statement herein, wherein placement of the extra capacitive element in the J-bit analog to digital converter impacts an amount of recoverable input range which can be recovered after calibration.

66. A method as in statement 62 or any other appropriate other statement herein, wherein a capacitance of the extra capacitive element in the J-bit analog to digital converter is approximately equal to a capacitance of a first one of the plurality of capacitive elements in the J-bit analog to digital converter, and wherein the first one of the plurality of capacitive elements corresponds to bit K of the J-bit analog to digital converter.

67. A method as in statement 62 or any other appropriate other statement herein, wherein a capacitance of the extra capacitive element in the J-bit analog to digital converter is approximately equal to a sum of a capacitance of a termination capacitive element for example (210 in FIG. 10) added to a capacitance of all ones of the plurality of capacitive elements corresponding to bit 0 through bit K−1 for example (211-216).

68. A method as in statement 62 or any other appropriate other statement herein, wherein the voltage step for example (VREFH-VREFL) provided at the second input of the comparator comprises a difference between a first voltage reference for example (VREFH) and a second voltage reference for example (VREFL).

69. A method as in statement 62 or any other appropriate other statement herein, wherein the voltage step for example (VREFH-VREFL) used to determine a value of the extra result bit is approximately equal to twice a standard voltage step, and wherein the standard voltage step is used to determine a value of bit J−1 of the uncalibrated digital result.

70. A method as in statement 62 or any other appropriate other statement herein, further comprising:
providing a differential bias capacitive element for example (208 in FIG. 10) in the analog to digital converter.

71. A method for example (271 of FIG. 11), comprising:
providing an analog to digital converter for example (12) which receives an analog input signal and produces a corresponding J-bit calibrated digital result value, the J-bit calibrated digital result value having bit 0 as a least significant bit, having bit J−1 as a most significant bit, and having bit K between bit 0 and bit J−1, wherein J and K are integers;

performing one or more successive approximations to generate bits J−1 to K for example (bits 15 to 11) of a J+1 bit uncalibrated digital result value for example (257 in FIG. 11);

performing one or more successive approximations to generate bits K−1 to 0 for example (bits 10 to 0) of the J+1 bit uncalibrated digital result value for example (259 in FIG. 11);

performing an extra comparison to generate an extra bit J+1 of the uncalibrated digital result value, wherein the extra bit J+1 is more significant than bit J for example (254-256, 258 in FIG. 11); and calibrating the J+1 bit uncalibrated digital result value to produce the J-bit calibrated digital result value for example (249 in FIG. 11).

72. A method as in statement 71 or any other appropriate other statement herein, wherein the step of calibrating does not reduce a predetermined range of the analog input signal.

73. A method as in statement 71 or any other appropriate other statement herein, wherein the step of performing the extra comparison to generate the extra bit J+1 of the uncalibrated digital result value comprises:
providing a voltage at an input of a comparator for example (60 in FIG. 3; 260 in FIG. 14; 460 in FIG. 18), wherein the voltage comprises a difference between a first reference voltage for example (VREFH) and a second reference voltage for example (VREFL).

74. A method as in statement 73 or any other appropriate other statement herein, wherein the first reference voltage is a high reference voltage and the second reference voltage is a low reference voltage, and wherein the step of providing the voltage at an input of the comparator provides the difference between the first reference voltage for example (VREFH) and the second reference voltage for example (VREFL) in a plurality of incremental voltage steps for example (up to "S" number of steps, wherein each of the "S" steps is a voltage step of approximately 1/"S" multiplied by the difference between VREFH and VREFL).

75. A method as in statement 71 or any other appropriate other statement herein, wherein the step of providing the analog to digital converter comprises:
providing a plurality of binary weighted capacitive elements for example (210-219 in FIG. 10).

76. A method as in statement 75 or any other appropriate other statement herein, wherein the step of providing the analog to digital converter further comprises:
providing an extra capacitive element for example (209 in FIG. 10), wherein a capacitance of the extra capacitive element is approximately equal to a capacitance of a first one of the plurality of binary weighted capacitive elements, and wherein the first one of the plurality of binary weighted capacitive elements corresponds to bit K of the analog to digital converter.

77. A method as in statement 76 or any other appropriate other statement herein, wherein a value of K affects an amount of recoverable input range which can be recovered after calibration.

78. A method as in statement 76 or any other appropriate other statement herein, wherein J equals 16 and K equals 11.

79. A method for example (271 of FIG. 11), comprising:
providing a J-bit analog to digital converter for example (12) having a plurality of capacitors for example (209-219) and having a comparator for example (60 of FIG. 3), the comparator having a first input, a second input, and an output;
providing a first voltage equal to a high reference voltage minus a low reference voltage for example (VREFH-VREFL) at the first input of the comparator by coupling all of the plurality of capacitors associated with bit J through bit K to the high reference voltage, and providing a second voltage at the second input of the comparator for example (252, 253, 254 of FIG. 11);
in response to said step of providing the first voltage at the first input of the comparator, providing a J+1 bit preliminary conversion result from the J-bit analog to digital converter, wherein the J+1 bit preliminary conversion result comprise an extra result bit for example (bit 16) for example (259 in FIG. 11);
in response to said step of providing the first voltage at the first input of the comparator, if the comparator output is a first value for example (low), the extra result bit is asserted for example (set), and a second most significant bit through bit K of the preliminary conversion result are negated for example (cleared), all of the plurality of capacitors associated with bit J through bit K remain coupled to the high reference voltage, and the next approximation continues with bit K−1 for example (258, 259 in FIG. 11); and
in response to said step of providing the first voltage at the first input of the comparator, if the comparator output is a second value for example (high), all of the plurality of capacitors associated with bit J through bit K are switched back to the low reference voltage, the extra result bit is negated for example (clear), and a standard SAR sequence begins at the second most significant bit for example (bit 15), wherein J and K are integers, and wherein the extra result bit is a most significant bit of the J+1 bit preliminary conversion result for example (256, 257, 259 in FIG. 11).

80. A method as in statement 79 or any other appropriate other statement herein, further comprising:
calibrating the J+1 bit preliminary conversion result to produce a J-bit calibrated conversion result for example (249 in FIG. 11).

81. A method as in statement 80 or any other appropriate other statement herein, wherein the step of calibrating does not reduce a predetermined range of the analog input signal.

82. A data converter for example (12 of FIG. 1; also see FIGS. 5 and 6), comprising:
conversion circuitry for example (62, 60, 76 of FIG. 3; 280, 282, 260, 261, 276 of FIG. 14) for receiving an input and providing an uncalibrated conversion result for example (84 of FIG. 3; 284, 285 of FIG. 14);
calibration storage circuitry for example (68 or 72 of FIG. 3; portion of 270 of FIG. 14) which stores a calibration value,
wherein the calibration value is produced by the data converter for example (12); and
result adjustment circuitry for example (70 of FIG. 3; 270 of FIG. 14), coupled to the conversion circuitry and the calibration storage circuitry for example (68 of FIG. 3), said result adjustment circuitry using the calibration value to digitally adjust the uncalibrated conversion result for example (84 of FIG. 3; 284, 285 of FIG. 14) to produce a calibrated conversion result for example (86 of FIG. 3; 286 of FIG. 14),
wherein the calibrated conversion result corresponds to the input.

83. A data converter as in statement 82 or any other appropriate other statement herein, wherein the conversion circuitry comprises a charge redistribution array for example (62 of FIG. 3; 280, 282 of FIG. 14), a comparator for example (60 of FIG. 3; 260 or 261 of FIG. 14), and SAR circuitry for example (76 of FIG. 3, 276 of FIG. 14).

84. A data converter as in statement 83 or any other appropriate other statement herein, wherein the comparator is a differential comparator for example (60 of FIG. 3).

85. A data converter as in statement 83 or any other appropriate other statement herein, wherein the charge redistribution array for example (62 of FIG. 3; 280, 282 of FIG. 14) comprises a plurality of capacitors for example (110-119 of FIG. 4; 210-219 of FIG. 10).

86. A data converter as in statement 85 or any other appropriate other statement herein, wherein the plurality of capacitors in the charge redistribution array are sized so that errors between conversion bits are always positive.

87. A data converter as in statement 85 or any other appropriate other statement herein, wherein the plurality of capacitors in the charge redistribution array are sized so that there are no non-monotinicities in the uncalibrated conversion result after conversion.

88. A data converter as in statement 82 or any other appropriate other statement herein, wherein the result adjustment circuitry comprises an accumulator for example (72 of FIG. 3).

89. A data converter as in statement 82 or any other appropriate other statement herein, wherein the result adjustment circuitry comprises circuitry for performing a mathematical operation for example (72, 74 in FIG. 3; 274 in FIG. 14), and wherein the mathematical operation is equivalent to subtracting the calibration value from the uncalibrated result to produce the calibrated result.

90. A data converter as in statement 82 or any other appropriate other statement herein, wherein the data converter comprises an analog to digital converter.

91. A data converter as in statement 82 or any other appropriate other statement herein, further comprising:
calibration control circuitry for example (66 of FIG. 3); and
a multiplexer for example (64 of FIG. 3) having a first data input coupled to the calibration control circuitry for example (66), having a second data input coupled to the conversion circuitry for example (76), having a control input coupled to the calibration control circuitry for example (66), and having an output coupled to the conversion circuitry for example (62), wherein the multiplexer for example (64) provides data from the first data input to the conversion circuitry for example (62) during a self-calibration process, and wherein the multiplexer for example (64) provides data from the second data input to the conversion circuitry for example (62) during a conversion process.

92. A data converter as in statement 82 or any other appropriate other statement herein, further comprising:

error determination circuitry for example (78 of FIG. 3), coupled to the conversion circuitry for example (76) and to the calibration storage circuitry for example (68).

93. A self-calibration method for example (150 of FIG. 5) for providing a calibration value for example (stored in calibration storage circuitry 68 or accumulator 72 of FIG. 3), the method comprising:

during a sample phase for example (142), sampling a first voltage for example (VREFH 88) on selected ones of a plurality of capacitors for example (110-119 of FIG. 4), sampling a second voltage for example (VREFL 90) on other selected ones of the plurality of capacitors for example (110-119 of FIG. 4), and charging inputs to a comparator to a common mode voltage for example (VCM 94);

releasing for example (143) the inputs to the comparator;

during a compare phase for example (144), sampling the second voltage for example (VREFL 90) on the selected ones of the plurality of capacitors for example (110-119 of FIG. 4), sampling the first voltage for example (VREFH 88) on the other selected ones of the plurality of capacitors for example (110-119 of FIG. 4);

performing successive approximation on selected bits; and storing for example (146) a result of the successive approximation as a first calibration value corresponding to a first one of the plurality of capacitors.

94. A method as in statement 93 or any other appropriate other statement herein, wherein the method is repeated for example (147) to produce a second calibration value corresponding to a second one of the plurality of capacitors.

95. A method as in statement 94 or any other appropriate other statement herein, wherein the first calibration value is added to an error value for example (from error determination circuitry 78 of FIG. 3) to produce the second calibration value for example (if accumulator 72 is used).

96. A method for example (150 of FIG. 5; 170 of FIG. 6), comprising:

executing a first portion for example (142) of a self-calibration sequence in a data converter for example (12) by performing steps [a], [b], and [c] in a sample phase of the data converter:

[a] charging a first terminal of a capacitive element to a first voltage for example (VREFL 90);

[b] charging a first terminal of each lower significance capacitive elements to a second voltage for example (VREFH 88); and

[c] charging inputs to a comparator to a third voltage for example (VCM 94);

releasing the inputs to the comparator for example (143);

executing a second portion for example (144) of the self-calibration sequence in the data converter by performing steps [g] and [h] in a compare phase of the data converter:

[g] switching the first terminal of the capacitive element to the second voltage for example (VREFH 88); and

[h] switching the first terminal of each lower significance capacitive elements to the first voltage for example (VREFL 90);

performing successive approximation on one or more bits of the data converter to produce a calibration value for example (145);

storing the calibration value in calibration storage circuitry for example (146; 68 of FIG. 3);

receiving a received input for example (VIN 92) to be converted by the data converter;

performing a conversion sequence on the received input to produce an uncalibrated result for example (162, 163, 164, 165); and mathematically combining the uncalibrated result and the calibration value to produce a calibrated result corresponding to the received input for example (166, 167).

97. A method as in statement 96 or any other appropriate other statement herein, wherein the first voltage is a first reference voltage, wherein the second voltage is a second reference voltage, and wherein the first reference voltage is lower than the second reference voltage.

98. A method as in statement 96 or any other appropriate other statement herein, wherein the steps of the first portion of the self-calibration sequence and the steps of the second portion of the self-calibration sequence are repeated for a second capacitive element in the data converter for example (147) before said step of performing the conversion sequence on the received input.

99. A method as in statement 96 or any other appropriate other statement herein, wherein the step of performing the conversion sequence comprises sampling an input voltage on less than all of the capacitive elements in a DAC in the data converter.

100. A method as in statement 96 or any other appropriate other statement herein, wherein the step of performing the conversion sequence comprises performing successive approximation to a predetermined accuracy level, and wherein the predetermined accuracy level is less than a maximum accuracy level of the data converter.

101. A method as in statement 96 or any other appropriate other statement herein, wherein the step of mathematically combining the uncalibrated result and the calibration value to produce a calibrated result corresponding to the received input comprises digitally adjusting the uncalibrated result based on which DAC capacitive elements remained coupled to the second voltage for example (VREFH 88) during the conversion sequence.

What is claimed is:

1. A data converter, comprising:

conversion circuitry for receiving an input and providing an uncalibrated conversion result;

calibration storage circuitry which stores a calibration value, wherein the calibration value is produced by the data converter;

error determination circuitry, coupled to the conversion circuitry and to the calibration storage circuitry; and result adjustment circuitry, coupled to the conversion circuitry and the calibration storage circuitry, said result adjustment circuitry using the calibration value to digitally adjust the uncalibrated conversion result to produce a calibrated conversion result, wherein the result adjustment circuitry comprises circuitry for performing a mathematical operation, and wherein the mathematical operation is equivalent to subtracting the calibration value from the uncalibrated conversion result to produce the calibrated conversion result, and wherein the calibrated conversion result corresponds to the input.

2. A data converter as in claim 1, wherein the conversion circuitry comprises a charge redistribution array, a comparator, and SAR circuitry.

3. A data converter as in claim 2, wherein the comparator is a differential comparator.

4. A data converter as in claim 2, wherein the charge redistribution array comprises a plurality of capacitors.

5. A data converter as in claim 4, wherein the plurality of capacitors in the charge redistribution array are sized so that errors between conversion bits are always positive.

6. A data converter as in claim 4, wherein the plurality of capacitors in the charge redistribution array are sized so that there are no non-monotonicities in the uncalibrated conversion result after conversion.

7. A data converter as in claim 1, wherein the result adjustment circuitry comprises an accumulator.

8. A data converter as in claim 1, wherein the data converter comprises an analog to digital converter.

9. A data converter as in claim 1, further comprising:
calibration control circuitry; and
a multiplexer having a first data input coupled to the calibration control circuitry, having a second data input coupled to the conversion circuitry, having a control input coupled to the calibration control circuitry, and having an output coupled to the conversion circuitry,
wherein the multiplexer provides data from the first data input to the conversion circuitry during a self-calibration process, and
wherein the multiplexer provides data from the second data input to the conversion circuitry during a conversion process.

10. A self-calibration method for providing a calibration value, the method comprising:
during a sample phase, sampling a first voltage on selected ones of a plurality of capacitors, sampling a second voltage on other selected ones of the plurality of capacitors, and charging inputs to a comparator to a common mode voltage;
releasing the inputs to the comparator;
during a compare phase, sampling the second voltage on the selected ones of the plurality of capacitors, sampling the first voltage on the other selected ones of the plurality of capacitors;
performing successive approximation on selected bits; and
storing a result of the successive approximation as a first calibration value corresponding to a first one of the plurality of capacitors.

11. A method as in claim 10, wherein the method is repeated to produce a second calibration value corresponding to a second one of the plurality of capacitors.

12. A method as in claim 11, wherein the first calibration value is added to an error value to produce the second calibration value.

13. A method, comprising:
executing a first portion of a self-calibration sequence in a data converter by performing steps [a], [b], and [c] in a sample phase of the data converter:
 [a] charging a first terminal of a capacitive element to a first voltage;
 [b] charging a first terminal of each lower significance capacitive elements to a second voltage; and
 [c] charging inputs to a comparator to a third voltage;
releasing the inputs to the comparator;
executing a second portion of the self-calibration sequence in the data converter by performing steps [g] and [h] in a compare phase of the data converter:
 [g] switching the first terminal of the capacitive element to the second voltage; and
 [h] switching the first terminal of each lower significance capacitive elements to the first voltage;
performing successive approximation on one or more bits of the data converter to produce a calibration value;
storing the calibration value in calibration storage circuitry;
receiving a received input to be converted by the data converter;
performing a conversion sequence on the received input to produce an uncalibrated result; and
mathematically combining the uncalibrated result and the calibration value to produce a calibrated result corresponding to the received input.

14. A method as in claim 13, wherein the first voltage is a first reference voltage, wherein the second voltage is a second reference voltage, and wherein the first reference voltage is lower than the second reference voltage.

15. A method as in claim 13, wherein the steps of the first portion of the self-calibration sequence and the steps of the second portion of the self-calibration sequence are repeated for a second capacitive element in the data converter before said step of performing the conversion sequence on the received input.

16. A method as in claim 13, wherein the step of performing the conversion sequence comprises sampling an input voltage on less than all of the capacitive elements in a DAC in the data converter.

17. A method as in claim 13, wherein the step of performing the conversion sequence comprises performing successive approximation to a predetermined accuracy level, and wherein the predetermined accuracy level is less than a maximum accuracy level of the data converter.

18. A method as in claim 13, wherein the step of mathematically combining the uncalibrated result and the calibration value to produce a calibrated result corresponding to the received input comprises digitally adjusting the uncalibrated result based on which DAC capacitive elements remained coupled to the second voltage during the conversion sequence.

* * * * *